United States Patent
Hosokawa

(10) Patent No.: US 9,099,672 B2
(45) Date of Patent: Aug. 4, 2015

(54) ORGANIC ELECTROLUMINESCENT ELEMENT AND ILLUMINATION DEVICE

(75) Inventor: Chishio Hosokawa, Sodegaura (JP)

(73) Assignee: IDEMITSU KOSAN CO., LTD., Tokyo (JP)

(*) Notice: Subject to any disclaimer, the term of this patent is extended or adjusted under 35 U.S.C. 154(b) by 0 days.

(21) Appl. No.: 13/981,602

(22) PCT Filed: Jan. 24, 2012

(86) PCT No.: PCT/JP2012/051438
§ 371 (c)(1),
(2), (4) Date: Jul. 24, 2013

(87) PCT Pub. No.: WO2012/102268
PCT Pub. Date: Aug. 2, 2012

(65) Prior Publication Data
US 2013/0299812 A1   Nov. 14, 2013

(30) Foreign Application Priority Data

Jan. 25, 2011   (JP) ................. 2011-013059

(51) Int. Cl.
*H01L 51/00* (2006.01)
*H01L 51/52* (2006.01)

(52) U.S. Cl.
CPC ........ *H01L 51/5212* (2013.01); *H01L 51/5228* (2013.01)

(58) Field of Classification Search
None
See application file for complete search history.

(56) References Cited

U.S. PATENT DOCUMENTS 7,495,389 B2 *   2/2009   Noguchi et al. ............. 313/506

FOREIGN PATENT DOCUMENTS

| | | |
|---|---|---|
| JP | 2001-345185 | 12/2001 |
| JP | 2003-017251 | 1/2003 |
| JP | 2003-257663 | 9/2003 |
| JP | 2003-288994 | 10/2003 |
| JP | 2006-059796 | 3/2006 |
| JP | 2008-010243 | 1/2008 |
| JP | 2008-103305 | 5/2008 |
| JP | 2009-237508 | 10/2009 |
| JP | 2011-034931 | 2/2011 |
| WO | WO 2008/126269 | 10/2008 |
| WO | WO 2010/041611 | 4/2010 |

OTHER PUBLICATIONS

International Preliminary Report on Patentability with Translation of Written Opinion of the International Searching Authority for corresponding International Application No. PCT/JP2012/051438, Jul. 30, 2013.
International Search Report for corresponding International Application No. PCT/JP2012/051438, Apr. 24, 2012.

* cited by examiner

*Primary Examiner* — Yasser A Abdelaziez
(74) *Attorney, Agent, or Firm* — Oblon, McClelland, Maier & Neustadt, L.L.P.

(57) ABSTRACT

An organic electroluminescence device includes: a first substrate, first electrode, organic compound layer and second electrode in this sequence. A first insulative portion and a second auxiliary electrode are formed between the first electrode and the second electrode in this sequence from the first electrode. The second electrode is in electric continuity with the second auxiliary electrode. The first electrode and the organic compound layer are insulated from the second auxiliary electrode by the first insulative portion.

19 Claims, 10 Drawing Sheets

ORGANIC ELECTROLUMINESCENT ELEMENT AND ILLUMINATION DEVICE

TECHNICAL FIELD

The present invention relates to an organic electroluminescence device and an illumination unit.

BACKGROUND ART

An organic electroluminescence device (hereinafter, referred to as an organic EL device) includes a pair of electrodes formed on a substrate and an organic compound layer including an emitting layer provided between the pair of electrodes.

At least one of the pair of electrodes of the organic EL device is provided by a transparent electrode, which is formed on a transparent substrate. As a material for forming the transparent electrode, a light transmissive material such as ITO and IZO (trademark) is used. For instance, in an organic EL device, light from the organic compound layer is transmitted through the transparent electrode and the transparent substrate to be extracted outside.

The material for forming the transparent electrode has a larger electrical resistance than metals. Accordingly, when the transparent electrode is planarly formed in a large area on the substrate, voltage declines sharply. Consequently, in the organic EL device, a luminance intensity in a surface of the substrate becomes uneven. This unevenness of the luminance intensity becomes prominent as separating from a component (e.g., an electrode pad) for supplying electricity from an exterior power supply to the transparent electrode since the luminance intensity is more largely influenced by the voltage decline.

In view of this, a method of providing an auxiliary electrode has been disclosed in order to decrease the voltage decline caused by the transparent electrode (see, for instance, Patent Literatures 1 to 3).

Patent Literature 1 discloses an electroluminescent panel to be also used as a light source of an illumination unit. The electroluminescent panel includes a substrate, a first electrode on the substrate, an auxiliary electrode formed on the first electrode, an emitting layer that is formed on the first electrode and the auxiliary electrode and defines an emitting region, and a second electrode formed on the emitting layer.

In the electroluminescent panel disclosed in Patent Literature 1, the auxiliary electrode and the emitting layer are in direct contact with each other. Accordingly, a luminescence intensity from the emitting layer around the auxiliary electrode becomes large, resulting in unevenness of the luminance intensity.

A method of avoiding unevenness of the luminance intensity occurring even when such an auxiliary electrode is provided is disclosed in, for instance, Patent Literatures 2 and 3.

Patent Literature 2 discloses a luminescence unit including a transparent substrate, a transparent electrode formed on the transparent substrate, a luminescence function layer formed on the transparent electrode, a metal-made backside electrode formed on the luminescence function layer, a first auxiliary electrode provided on the transparent electrode, and a second auxiliary electrode provided on the backside electrode. By positioning the first and second auxiliary electrodes so as not to face each other across the luminescence function layer, unevenness of the luminance intensity is inhibited.

Patent Literature 3 discloses an organic EL emitting unit to be also used as an illumination unit. In the organic EL emitting unit, a transparent electrode is formed on a transparent glass substrate, an auxiliary substrate in a predetermined pattern is formed on the transparent electrode, and the auxiliary electrode is coated with an insulative layer of a laminate structure. Moreover, an organic EL layer is formed on the transparent electrode. An opposing electrode is provided to cover the insulative layer and the organic EL layer. In the organic EL emitting unit, since the auxiliary electrode is coated with the insulative layer so that the auxiliary electrode and the organic EL device are not in direct contact with each other, unevenness of the luminance intensity is inhibited.

CITATION LIST

Patent Literatures

Patent Literature 1: JP-A-2008-103305
Patent Literature 2: International Publication No. WO2008/126269
Patent Literature 3: JP-A-2008-10243

SUMMARY OF THE INVENTION

Problems to be Solved by the Invention

However, the luminescence unit disclosed in Patent Literature 2 still has a large unevenness of the luminance intensity.

Moreover, an auxiliary electrode for the opposing electrode is not formed in the organic EL emitting unit disclosed in Patent Literature 3. Accordingly, when the opposing electrode is provided by a transparent electrode, voltage at the opposing electrode declines to cause unevenness of the luminance intensity.

An object of the invention is to provide an organic EL device in which unevenness of the luminance intensity is inhibited, and an illumination unit including the organic EL device.

Means for Solving the Problems

An organic electroluminescence device according to an aspect of the invention includes: a first substrate; a first electrode; an organic compound layer; and a second electrode, the first substrate, first electrode, organic compound layer and the second electrode being disposed in this sequence; and a first insulative portion and a second auxiliary electrode formed between the first electrode and the second electrode in this sequence from the first electrode, in which the second electrode is in electrical continuity with the second auxiliary electrode, and the first electrode and the organic composition layer are insulated from the second auxiliary electrode by the first insulative portion.

According to the above aspect of the invention, the first insulative portion and the second auxiliary electrode are formed between the first electrode and the second electrode in this sequence from the first electrode, and the second electrode is in electrical continuity with the second auxiliary electrode. Accordingly, a voltage decline in the second electrode is decreased, so that unevenness of the luminance intensity can be inhibited. Further, the organic compound layer is insulated from the second auxiliary electrode by the first insulative portion. In other words, the organic compound layer and the second auxiliary electrode are not directly electrically connected to each other, so that unevenness of the luminance intensity can be inhibited.

Moreover, with this arrangement, since the first electrode is insulated from the second auxiliary electrode by the first insulative portion, a short circuit of the organic EL device can be prevented.

The organic EL device according to the above aspect of the invention preferably further includes a first auxiliary electrode formed between the first electrode and the first insulative portion, in which the first electrode is in electrical continuity with the first auxiliary electrode, and the organic compound layer is insulated from the first auxiliary electrode by the first insulative portion.

With this arrangement, the first auxiliary electrode is formed between the first electrode and the first insulative portion, and the first electrode is in electrical continuity with the first auxiliary electrode. Accordingly, a voltage decline in the first electrode in addition to the second electrode is also decreased, so that unevenness of the luminance intensity can be inhibited.

Further, the organic compound layer is insulated from the first auxiliary electrode by the first insulative portion. In other words, the organic compound layer and the first auxiliary electrode are not directly electrically connected to each other, so that unevenness of the luminance intensity can be inhibited.

Moreover, with this arrangement, the first auxiliary electrode, the first insulative portion and the second auxiliary electrode are formed on the first electrode in this sequence. In other words, the first and second electrodes are formed to face each other across the first insulative portion. Accordingly, an aperture ratio of the organic EL device can be improved.

With this arrangement, by the first insulative portion, the first auxiliary electrode is insulated from the second auxiliary electrode, the first auxiliary electrode is insulated from the second electrode, and the second auxiliary electrode is insulated from the first electrode. Consequently, a short circuit of the organic EL device can be prevented.

The organic EL device according to the above aspect of the invention preferably further includes a first auxiliary electrode and a second insulative portion formed in this sequence from the first electrode between the first and second electrodes and at a position where the first insulative portion and the second auxiliary electrode are not formed, in which the first electrode is in electrical continuity with the first auxiliary electrode, and the organic compound layer is insulated from the first auxiliary electrode by the second insulative portion.

With this arrangement, the first auxiliary electrode and the second insulative portion are formed in this sequence from the first electrode between the first and second electrodes and at a position where the first insulative portion and the second auxiliary electrode are not formed. The first electrode is in electrical continuity with the first auxiliary electrode. Accordingly, a voltage decline in the first electrode in addition to the second electrode is also decreased, so that unevenness of the luminance intensity can be inhibited.

Further, the organic compound layer is insulated from the first auxiliary electrode by the second insulative portion. In other words, the organic compound layer and the first auxiliary electrode are not directly electrically connected to each other, so that unevenness of the luminance intensity can be inhibited.

Further, the first auxiliary electrode is insulated from the second electrode by the first insulative portion. Consequently, a short circuit of the organic EL device can be prevented.

In the organic EL device according to the above aspect of the invention, it is preferable that the first insulative portion and the second insulative portion are formed of the same material.

With this arrangement, since the first and second insulative portions are formed of the same material, the first and second insulative portions can be formed in the same process. Accordingly, a manufacturing process of the organic EL device can be simplified.

In the organic EL device according to the above aspect of the invention, it is preferable that a distance between the second auxiliary electrode and the first electrode is larger than a thickness of the organic compound layer.

With this arrangement, a distance between the second auxiliary electrode and the first electrode is larger than a thickness of the organic compound layer. Accordingly, the organic compound layer and the second auxiliary electrode are not directly electrically connected to each other, so that unevenness of the luminance intensity can be inhibited.

An organic electroluminescence device according to another aspect of the invention includes: a first substrate; a first electrode formed on the first substrate; an organic compound layer formed on the first electrode; a second electrode formed on the organic compound layer; and a second auxiliary electrode in electric continuity with the second electrode, the second auxiliary electrode being formed on the first substrate.

According to the above aspect of the invention, the second auxiliary electrode is formed on not on the first electrode but on the first substrate. Accordingly, a pressure for forming the second auxiliary electrode of a conductive paste and the like by printing or coating is not applied on the first electrode. Consequently, since the first electrode is prevented from being damaged, the organic EL device can emit light more evenly.

Moreover, since electrical continuity between the second electrode and the second auxiliary electrode is established, a voltage decline in the second electrode is decreased, so that unevenness of the luminance intensity can be inhibited.

The organic EL device according to the above aspect of the invention preferably further includes an insulative portion formed between the first electrode and the second auxiliary electrode and between the organic compound layer and the second auxiliary electrode, in which the first electrode and the organic composition layer are insulated from the second auxiliary electrode by the insulative portion.

With this arrangement, the organic compound layer is insulated from the second auxiliary electrode by the first insulative portion. In other words, the organic compound layer and the second auxiliary electrode are not directly electrically connected to each other, so that unevenness of the luminance intensity can be inhibited.

With this arrangement, since the first electrode is insulated from the second auxiliary electrode by the first insulative portion, a short circuit of the organic EL device can be prevented.

In the organic EL device according to the above aspect of the invention, it is preferable that the first substrate includes a body shaped in a flat plate and a protrusion perpendicularly projecting from a surface of the body, the first electrode, the organic compound layer and the second electrode are formed on the protrusion, and the second auxiliary electrode is formed on the body.

With this arrangement, the second auxiliary electrode is formed on not on the first electrode but the first substrate. Further, the second auxiliary electrode is not formed on the protrusion of the first substrate on which the first electrode is formed, but formed on the body of the first substrate. Since a position at which the first electrode is formed is remote from a position at which the second auxiliary electrode is formed, the pressure for forming the second auxiliary electrode of a conductive paste and the like by printing or coating can be more reliably prevented from being applied on the first electrode. Consequently, since the first electrode is more reliably prevented from being damaged, the organic EL device can emit light more evenly.

Moreover, since electrical continuity between the second electrode and the second auxiliary electrode is established, a voltage decline in the second electrode is decreased, so that unevenness of the luminance intensity can be inhibited.

The organic EL device according to the above aspect of the invention preferably further includes a first auxiliary electrode in electric continuity with the first electrode, the first auxiliary electrode being formed on the body; and an insulative portion formed between the first auxiliary electrode and the second auxiliary electrode, in which the first auxiliary electrode is insulated from the second auxiliary electrode by the insulative portion.

With this arrangement, the first auxiliary electrode is formed not on the first electrode but on the body of the first substrate. Since a position at which the first electrode is formed is remote from a position at which the first auxiliary electrode is formed, the pressure for forming the first auxiliary electrode of a conductive paste and the like by printing or coating can be more reliably prevented from being applied on the first electrode. Consequently, since the first electrode is more reliably prevented from being damaged, the organic EL device can emit light more evenly.

Moreover, since electrical continuity between the first electrode and the first auxiliary electrode is established, a voltage decline in the first electrode is decreased, so that unevenness of the luminance intensity can be inhibited.

Further, since the first auxiliary electrode is insulated from the second auxiliary electrode by the insulative portion, a short circuit of the organic EL device can be prevented.

In the organic EL device according to the above aspect of the invention, it is preferable that the body and the protrusion are formed of different members.

With this arrangement, since the body and the protrusion are formed of different members, it is not necessary to form the body and the protrusion by processing a single member, but it is only necessary to bond the member of the body to the member of the protrusion, so that the first substrate is easily manufactured at a low manufacturing cost.

For instance, when the first substrate is formed of glass and/or a transparent resin, processing such as etching or cutting is required to form the body and the protrusion from a sheet of glass plate and/or transparent resin, thereby increasing the manufacturing cost. According to the above aspect of the invention, since the first substrate having the body and the protrusion can be manufactured by bonding a glass plate and/or a transparent resin plate in different sizes, the first substrate can be easily manufactured at a low cost.

Herein, "different members" mean that the member of the body and the member of the protrusion are independent members, of which materials may be the same or different.

It is not intended in the above description that the invention should exclude integral formation of the body and the protrusion.

An organic electroluminescence device according to still another aspect of the invention includes: a first substrate; an insulative portion formed on the first substrate; a first electrode formed on the insulative portion; an organic compound layer formed on the first electrode; a second electrode formed on the organic compound layer;

a first auxiliary electrode in electrical continuity with the first electrode; and a second auxiliary electrode in electrical continuity with the second electrode, the first auxiliary electrode and the second auxiliary electrode being formed on the first substrate through the insulative portion, in which the first auxiliary electrode is insulated from the second auxiliary electrode by the insulative portion, and a thickness of the insulative portion is larger than each of those of the first auxiliary electrode and the second auxiliary electrode when the organic EL device is seen in a cross section in a thickness direction of the first substrate.

According to the above aspect of the invention, the first auxiliary electrode and the second auxiliary electrode are formed not on the first electrode but on the first substrate. Accordingly, a pressure for forming the first auxiliary electrode and the second auxiliary electrode of a conductive paste and the like by printing or coating is not applied on the first electrode. Consequently, since the first electrode is prevented from being damaged, the organic EL device can emit light more evenly.

Moreover, a voltage decline in the first electrode is decreased since electrical continuity between the first electrode and the first auxiliary electrode is established while a voltage decline in the second electrode is decreased since electrical continuity between the second electrode and the second auxiliary electrode is established, so that unevenness of the luminance intensity can be inhibited.

Further, when the organic EL device is seen in a cross section in a thickness direction of the first substrate, a thickness of the insulative portion is larger than each of those of the first and second auxiliary electrodes. Accordingly, the organic compound layer formed on the first electrode on the insulative portion is formed at a position remote from the first or second auxiliary electrode. Accordingly, the organic compound layer is not directly electrically connected to the first or second auxiliary electrode, so that unevenness of the luminance intensity can be inhibited.

Further, since the first auxiliary electrode is insulated from the second auxiliary electrode by the insulative portion, a short circuit of the organic EL device can be prevented.

The organic EL device according to the above aspect of the invention preferably further includes a second substrate disposed to face the first substrate through the organic compound layer and the second electrode, in which the first substrate and the second substrate are transparent substrates, and the first electrode and the second electrode are transparent electrodes.

With this arrangement, the first and second substrates each are a transparent substrate and the first and second electrodes each are a transparent electrode. Accordingly, light emitted in the organic compound layer can be efficiently extracted through the first and second substrates.

Consequently, the organic EL device according to the above aspect of the invention can be provided by a device emitting through both the first substrate and the second substrate.

In the organic EL device according to the above aspect of the invention, it is preferable that at least one of the first auxiliary electrode and the second auxiliary electrode includes: at least one of silver, gold, tungsten, aluminum and nickel; and a binder.

With this arrangement, at least one of the first and second auxiliary electrodes contains: at least one of silver, gold, tungsten, aluminum and nickel; and a binder. Accordingly, the at least one of the first and second auxiliary electrodes is formable of a conductive paste. When using a conductive paste, an auxiliary electrode is easily formable by printing, coating or the like, thereby decreasing resistance of the formed auxiliary electrode.

An illumination unit according to a further aspect of the invention includes the organic electroluminescence device according to any one of the above aspects of the invention.

According to the above aspect of the invention, since the illumination unit includes any one of the organic EL device according to the above aspect of the invention, unevenness of luminance intensity is inhibited in the illumination unit. In this illumination unit, unevenness of luminance intensity is inhibited even in a large area.

DESCRIPTION OF EMBODIMENT(S)

First Exemplary Embodiment

Figure 1:
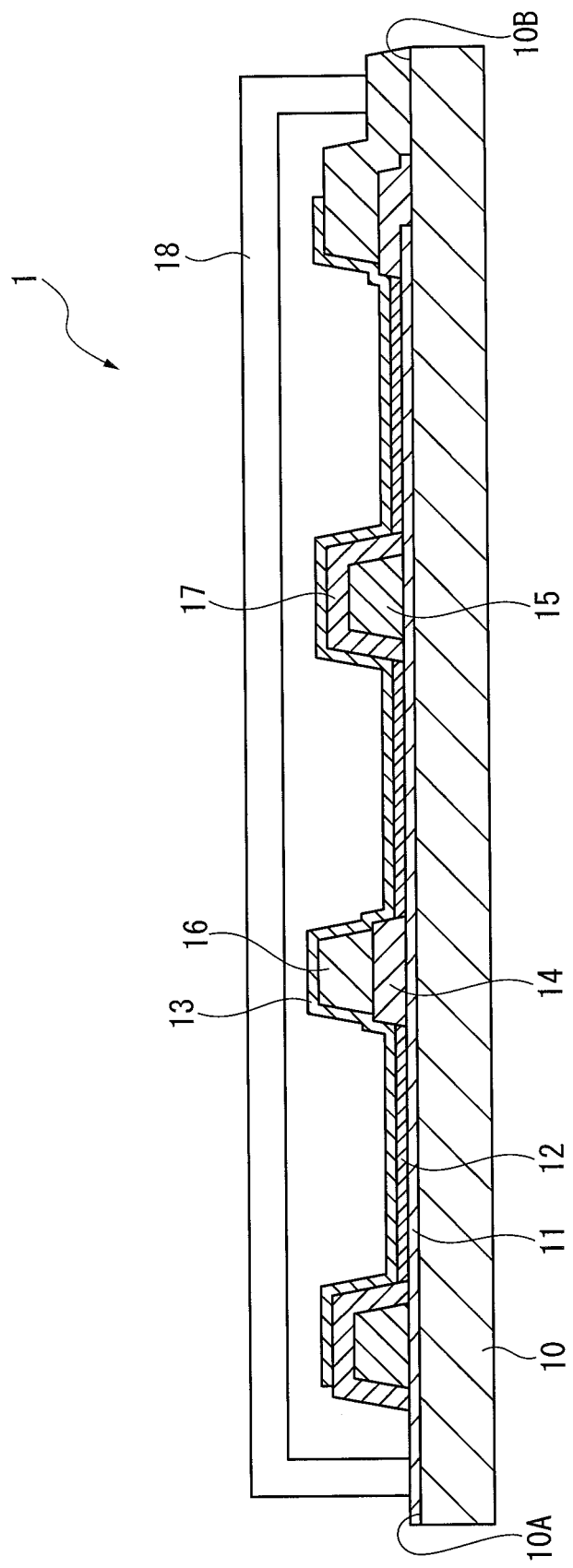
FIG. 1 is a cross-sectional view of an organic EL device according to a first exemplary embodiment.

A first exemplary embodiment of the invention will be described below with reference to the attached drawings.
Overall Structure of Photoelectric Conversion Device FIG. 1 is a cross-sectional view along a thickness direction of a substrate of an organic EL device 1 according to a first exemplary embodiment of the invention. FIGS. 2A to 2D and 3A to 3C each are a schematic view explaining a manufacturing process of the organic EL device 1.

In the organic EL device 1, a first substrate 10, a first electrode 11, an organic compound layer 12, a second electrode 13, and a second substrate 18 are provided in this sequence. A first insulative portion 14 and a second auxiliary electrode 16 are formed between the first electrode 11 and the second electrode 13 in this sequence from the first electrode 11. Moreover, a first auxiliary electrode 15 and a second insulative portion 17 are formed in this sequence from the first electrode 11 between the first electrode 11 and the second electrode 13 and at a position where the first insulative portion 14 and the second auxiliary electrode 16 are not formed.

It should be noted that, when directions showing the top, bottom, right and left are used in the description of the first exemplary embodiment, the directions are defined supposing that the first substrate 10 is at the bottom while the second substrate 18 is at the top as shown in the cross-sectional view of FIG. 1.
First Substrate The first substrate 10 is a smooth and flat plate member for supporting the first electrode 11 and the like.

In the first exemplary embodiment, the first substrate 10 is provided by a light-transmissive transparent substrate, so that light emitted from the organic compound layer 12 is adapted to be extracted through the first substrate 10. Accordingly, a light transmittance of the first substrate 10 in a visible region of 400 nm to 700 nm is preferably 50% or more.

The first substrate 10 is exemplified by a glass plate, a polymer plate or the like. For the glass plate, such materials as soda-lime glass, barium/strontium-containing glass, lead glass, aluminosilicate glass, borosilicate glass, barium borosilicate glass, quartz and the like can be used. For the polymer plate, materials such as polycarbonate resins, acryl resins, polyethylene terephthalate resins, polyether sulfide resins and polysulfone resins can be used. When the organic EL device 1 is applied to a usage requiring flexibility, the material of the first substrate 10 is preferably a flexible material such as a polymer plate.

When a plurality of organic EL devices 1 adjacent to each other is used as a light source for illumination, the first substrate 10 may be, for instance, a plate having a longitudinal length of about 80 mm to 100 mm, a lateral length of about 80 mm to 100 mm, and a thickness of 0.1 mm to 5 mm. A large-sized substrate material may be cut into a plurality of first substrates 10 in use.

A part of the periphery of the first substrate 10 is provided with a first electrode drawing portion 10A for drawing electricity from the first electrode 11 and a second electrode drawing portion 10B for drawing electricity from the second electrode 13. In the first exemplary embodiment, as shown in FIG. 1, one end of the first substrate 10 is the first electrode drawing portion 10A and the other end of the first substrate 10 is the second electrode drawing portion 10B.

First Electrode

The first electrode 11 serves for injecting holes into the organic compound layer 12 as the anode of the organic EL device 1. It is effective that the first electrode 11 has a work function of 4.5 eV or more.

The first electrode 11 is formed on the first substrate 10. In this arrangement, the first electrode 11 extends over the first electrode drawing portion 10A. The organic EL device 1 is electrically connected to the outside via the first electrode 11 on the first electrode drawing portion 10A.

Examples of a material for the first electrode 11 are indium-tin oxide (ITO), tin oxide (NWSA), indium zinc oxide (IZO), gold, silver, platinum and copper.

In the organic EL device 1, the first electrode 11 is preferably a transparent electrode since emission from the organic compound layer 12 is extracted through the first substrate 10. In this arrangement, light transmittance of the first electrode 11 in the visible region is preferably more than 10%. Examples of a material for the transparent electrode are ITO and IZO.

Sheet resistance of the first electrode 11 is preferably several hundreds Ω per square or less.

A thickness of the first electrode 11 is typically in a range of 10 nm to 1 μm and preferably in a range of 10 nm to 200 nm, though it depends on the material of the first electrode 11.

Auxiliary Electrode

The first auxiliary electrode 15 is formed of a material having electric resistance smaller than that of the material for the first electrode 11, whereby a voltage decline due to electric resistance property of the first electrode 11 is prevented.

The first auxiliary electrode 15 is formed on the first electrode 11 and is in electrical continuity with the first electrode 11. The first auxiliary electrode 15 is formed, for instance, in a stripe or in a comb shape. Moreover, the first auxiliary electrode 15 may be formed to extend over the first electrode drawing portion 10A, whereby the organic EL device 1 may be electrically connected to the outside via the first auxiliary electrode 15.

The first auxiliary electrode 15 is covered with the second insulative portion 17, so that the organic compound layer 12 and the second electrode 13 are electrically insulated from the first auxiliary electrode 15.

The second auxiliary electrode 16 is formed of a material having electric resistance smaller than that of the material for the second electrode 13, whereby a voltage decline due to electric resistance property of the second electrode 13 is prevented.

The second auxiliary electrode 16 is formed on the first insulative portion 14 and is in electrical continuity with the second electrode 13. The second auxiliary electrode 16 is formed, for instance, in a stripe or in a comb shape.

Since the first insulative portion 14 is formed between the second auxiliary electrode 16 and the first electrode 11, the first electrode 11 and the second auxiliary electrode 16 are electrically insulated from each other. Moreover, since the second auxiliary electrode 16 is formed on the first insulative portion 14 so as not to be electrically connected to the organic compound layer 12, the second auxiliary electrode 16 is also electrically insulated from the organic compound layer 12.

The first auxiliary electrode 15 and the second auxiliary electrode 16 are formed of well-known electrode materials: metals and alloys may be used. Examples of the metals are silver (Ag), Al (aluminum), Au (gold), W (tungsten) and Ni (nickel). Each of the first auxiliary electrode 15 and the second auxiliary electrode 16 preferably contains at least one of the metals.

Moreover, the first auxiliary electrode 15 and the second auxiliary electrode 16 may be formed of a material containing the metals, alloys thereof and a binder. Specifically, the first auxiliary electrode 15 and the second auxiliary electrode 16 are preferably formed of a conductive paste material containing the metals, the alloys and the binder. Examples of the binder are a resin material and an inorganic material. Examples of the resin material for the binder are an acrylic resin and PET (polyethylene terephthalate). The inorganic material for the binder is exemplified by glass frit. The conductive paste material may additionally contain an organic solvent for viscosity adjustment so that the conductive paste material is provided in a paste. The conductive paste material is preferably a silver paste. When the conductive paste material is used, a thickness of each of the first auxiliary electrode 15 and the second auxiliary electrode 16 is preferably in a range of 1 μm to 50 μm.

Insulative Portion

The first insulative portion 14 is formed on the first electrode 11. The second auxiliary electrode 16 is formed on the first insulative portion 14 and is electrically insulated from the first electrode 11.

The second insulative portion 17 is formed to cover the first auxiliary electrode 15. Accordingly, the first auxiliary electrode 15 is electrically insulated from the second electrode 13, so that the first auxiliary electrode 15 is electrically insulated from the organic compound layer 12.

In the organic EL device 1, a distance between the second auxiliary electrode 16 and the first electrode 11 is preferably larger than a thickness of the organic compound layer 12. In view of this, the thickness of the first insulative portion 14 is formed larger than that of the organic compound layer 12 in the organic EL device 1. With thus defined relationship in thickness, a distance between the second auxiliary electrode 16 and the first electrode 11 becomes larger than the thickness of the organic compound layer 12. Herein, the organic compound layer 12 is not in contact with the second auxiliary electrode 16 formed on the first insulative portion 14, whereby the organic compound layer 12 is not electrically connected to the second auxiliary electrode 16.

Since the thickness of the organic compound layer 12 is generally formed at 1 μm or less, the thickness of the first insulative portion 14 is preferably in a range of 1 μm to 50 μm. With this thickness, electrical connection between the organic compound layer 12 and the second auxiliary electrode 16 is prevented. Consequently, electrons are prevented from being directly injected from the second auxiliary electrode 16 to the organic compound layer 12, thereby inhibiting unevenness of the luminance intensity.

The first insulative portion 14 and the second insulative portion 17 only need to be formed of an electrically insulative material. Examples of the electrically insulative material are a photosensitive resin (e.g., photosensitive polyimide), a photocurable resin (e.g., an acrylic resin), a thermosetting resin and an inorganic material (e.g., silicon oxide ($SiO_2$) and aluminum oxide ($Al_2O_3$)). The photosensitive resin may be a positive photosensitive resin or a negative photosensitive resin.

Moreover, the second insulative portion 17 may be formed of a material different from the material of the first auxiliary electrode 15. Alternatively, a surface of the first auxiliary electrode 15 may be processed to modify the conductive material of the first auxiliary electrode 15 into an insulative material (e.g., a metal oxide film).

Organic Compound Layer

The organic compound layer 12 includes at least one layer formed of an organic compound. The organic compound layer 12 may include an inorganic compound.

The organic compound layer 12 is formed on the first electrode 11. As described above, the organic compound layer 12 is electrically insulated from the first auxiliary electrode 15 and the second auxiliary electrode 16.

In the organic EL device 1, the organic compound layer 12 includes at least one emitting layer. Accordingly, the organic compound layer 12 may be provided by a single emitting layer. Alternatively, the organic compound layer 12 may be provided by a laminate including the emitting layer and layers applied in a known organic EL device such as a hole injecting layer, a hole transporting layer, an electron injecting layer and an electron transporting layer.

The emitting layer, which is formed of known emitting materials used in a typical organic EL device, provides a single-color emission such as red, green, blue or yellow emission, and combined-color emission (e.g., white-color emission) of red, green, blue and yellow emissions. In forming the emitting layer, a doping method, according to which an emitting material (dopant) is doped to a host, has been known as a usable method. The emitting layer formed by the doping method can efficiently generate excitons from charges injected into the host. With the exciton energy generated by the excitons being transferred to the dopant, the dopant can emit light with high efficiency.

The emitting layer may be fluorescent or phosphorescent.

A thickness of the emitting layer is preferably in a range of 5 nm to 50 nm, more preferably in a range of 7 nm to 50 nm and most preferably in a range of 10 nm to 50 nm. The thickness of less than 5 nm may cause difficulty in forming the emitting layer and in controlling chromaticity, while the thickness of more than 50 nm may raise drive voltage of the device.

A material of the hole injecting layer, hole transporting layer, electron injecting layer, the electron transporting layer and the like may be optionally selected from well-known materials used in a typical organic EL device.

A thickness of each of the layers included in the organic compound layer 12 is not particularly limited except for a particularly defined thickness of each of the above-mentioned layers. However, the thickness of each of the layers is preferably typically in a range from several nanometers to 1 μm because an excessively thin layer is likely to cause defects such as a pin hole while an excessively thick layer requires application of high voltage to deteriorate efficiency.

Second Electrode

The second electrode 13 serves for injecting electrons into the organic compound layer 12 as the cathode of the organic EL device 1. It is effective that the second electrode 13 has a small work function.

The second electrode 13 is formed on the organic compound layer 12, the second auxiliary electrode 16 and the second insulative portion 17.

The second electrode 13 is electrically connected to the second auxiliary electrode 16 through the second electrode drawing portion 10B. The second auxiliary electrode 16 extends over the second electrode drawing portion 10B. The organic EL device 1 is electrically connected to the outside via the second auxiliary electrode 16.

In the organic EL device 1, the second electrode 13 is preferably a transparent electrode since emission from the organic compound layer 12 is extracted through not only the first substrate 10 but also the second substrate 18. In view of this, light transmittance of the second electrode 13 in the visible region is preferably more than 10%.

Sheet resistance of the second electrode 13 is preferably several hundreds Ω per square or less.

A thickness of the second electrode 13 is typically in a range of 10 nm to 1 μm, and preferably in a range of 10 nm to 200 nm, though it depends on the material of the second electrode 13.

Examples of the transparent electrode are ITO and IZO.

When emission from the organic compound layer 12 is not extracted through the second substrate 18, specific examples of the material for the second electrode 13, although not particularly limited, are indium, aluminum, magnesium, silver, alloy of magnesium and indium, alloy of magnesium and aluminum, alloy of aluminum and lithium, alloy of aluminum, scandium and lithium, and alloy of magnesium and silver.

Second Substrate

The second substrate 18 is disposed to face the first substrate 10 and is bonded to the first substrate 10 by a bonding member (not shown). The organic compound layer 12 is housed between the second substrate 18 and the first substrate 10 mutually bonded, whereby the organic compound layer 12 is sealed.

The second substrate 18 is preferably a member in a plate, a film or a foil. Specifically, examples of the second substrate 18 are a glass plate, a polymer plate, a glass film, a polymer film, a metal plate and a metal foil.

For the glass plate, such materials as soda-lime glass, barium/strontium-containing glass, lead glass, aluminosilicate glass, borosilicate glass, barium borosilicate glass, quartz and the like can be used.

For the polymer plate, materials such as polycarbonate resins, acryl resins, polyethylene terephthalate resins, polyether sulfide resins and polysulfone resins can be used. For the polymer film, a polymer film made from the above resins is usable.

Although the second substrate 18 is a plate member in the exemplary embodiment, the second substrate 18 may be in a form of a sheet or a film.

When the organic EL device 1 is applied to a usage requiring flexibility, the material of the second substrate 18 is preferably a flexible material such as a polymer plate or a polymer film.

Moreover, a glass plate and a glass film are preferable because of serving as an excellent barrier to water and oxygen.

In the organic EL device 1, as described above, the second substrate 18 is preferably a transparent substrate since emission from the organic compound layer 12 is extracted through not only the first substrate 10 but also the second substrate 18. Accordingly, a light transmittance of the second substrate 18 in a visible region of 400 nm to 700 nm is preferably 50% or more.

In the organic EL device 1, a concave portion is formed on the second substrate 18 so that the second electrode 13 and the like are not contacted with the second substrate 18.

When a plurality of organic EL devices 1 adjacent to each other is used as a light source for illumination, the second substrate 18 may be, for instance, a plate having a longitudinal length of about 80 mm to 100 mm, a lateral length of about 80 mm to 100 mm, and a thickness of 0.1 mm to 5 mm. When the thickness is 0.1 mm or less, a transmittance of air is raised to reduce a seal capability of the second substrate 18.

A large-sized substrate material may be cut into a plurality of second substrates 18 in use.

The bonding member described above is preferably formed of an inorganic compound in terms of sealability, moisture-resistant property and bonding strength. When the second substrate 18 is a glass plate or a glass film, the bonding member is preferably a low-melting-point glass since the low-melting-point glass is bondable by laser irradiation. Herein, the low melting point refers to 650 degrees C. or less of the melting point. The melting point is preferably 300 degrees C. to 600 degrees C. The low-melting-point glass preferably contains, as a component, a transition metal oxide, a rare earth oxide and the like which are capable of bonding glass to metal and the like, more preferably contains granulated glass (frit glass). A composition of the granulated glass preferably includes $SiO_2$, $B_2O_3$ and $Al_2O_3$.

Manufacturing Process of Organic EL Device

Next, a manufacturing method of the organic EL device 1 will be described with reference to the attached drawings.

Figure 2A:
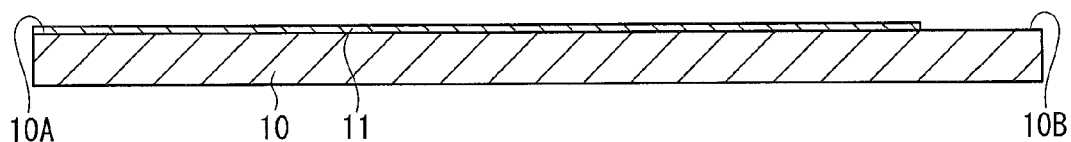
FIG. 2A is a schematic view explaining a manufacturing process of the organic EL device according to the first exemplary embodiment, in which a process of forming a first electrode on a first substrate is explained.

Firstly, the first electrode 11 is formed on the first substrate 10 as shown in FIG. 2A. Herein, the first electrode 11 is also formed on the first electrode drawing portion 10A. The first substrate 10 is provided by a transparent glass substrate. The first electrode 11 is provided by a material for a transparent electrode.

A forming method of the first electrode 11 is exemplified by a method in which a film is formed by a sputtering method and the film is treated by a patterning method in a photolithography process, or a mask evaporation method.

Figure 2B:
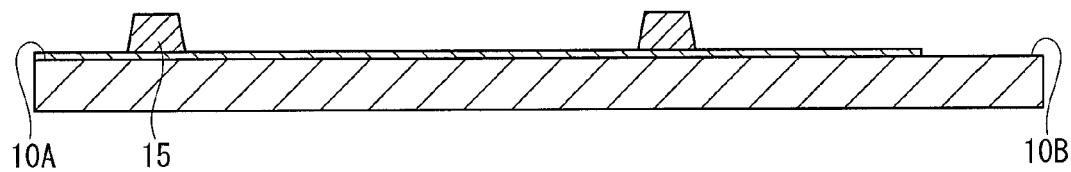
FIG. 2B is a schematic view explaining a process of forming a first auxiliary electrode on the first electrode after the process shown in FIG. 2A.

Next, the first auxiliary electrode 15 is formed on the first electrode 11 as shown in FIG. 2B.

As a forming method of the first auxiliary electrode 15, known methods of dry film-forming such as vacuum deposition, sputtering, plasma or ion plating and wet film-forming such as screen printing, inkjet printing, spin coating, dipping or flow coating are applicable.

In the organic EL device 1, the first auxiliary electrode 15 is formed by screen printing using silver paste as the conductive paste material. Specifically, after the silver paste is applied at a predetermined position on the first electrode 11 by screen printing, the paste material is dried to form the first auxiliary electrode 15.

Figure 2C:
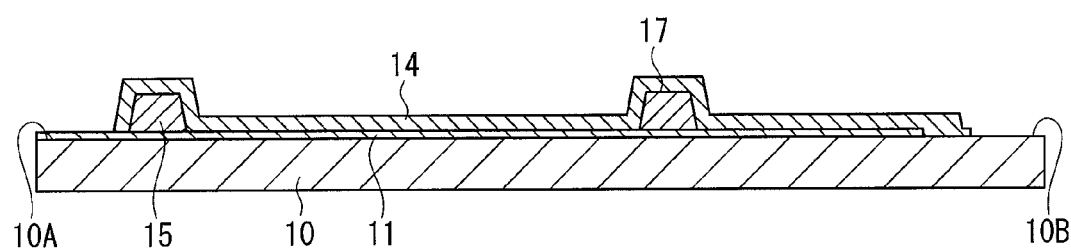
FIG. 2C is a schematic view explaining a process of forming first and second insulative portions after the process shown in FIG. 2B.
Figure 2D:
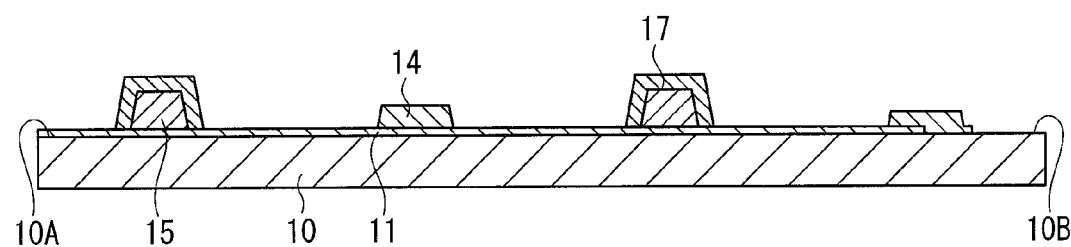
FIG. 2D is a schematic view explaining another process of forming the first and second insulative portions after the process shown in FIG. 2C.

Next, as shown in FIGS. 2C and 2D, the first insulative portion 14 is formed on the first electrode 11 and the first auxiliary electrode 15 while the second insulative portion 17 is formed on the first electrode 11. As a forming method of the first insulative portion 14 and the second insulative portion 17, known methods of wet film-forming such as screen printing, inkjet printing, spin coating, dipping or flow coating and dry film-forming such as mask evaporation or mask sputtering are applicable.

In the organic EL device 1, the first insulative portion 14 and the second insulative portion 17 are formed of the same material. Accordingly, the first insulative portion 14 and the second insulative portion 17 are formed by wet film-forming using a positive photoresist material containing an electrically insulative resin as the electrically insulative material.

As shown in FIG. 2C, firstly, the above photoresist material in a paste is applied over the first electrode 11 and the first auxiliary electrode 15 by wet film-forming.

After application, the obtained film except for a part where the first insulative portion 14 and the second insulative portion 17 are to be formed is irradiated with light (exposed to light) using a mask having a predetermined shape. When the film exposed to light is developed by a developing solution, the photoresist material remains on the part not irradiated with light, so that the first insulative portion 14 and the second insulative portion 17 are formed as shown in FIG. 2D.

Figure 3A:
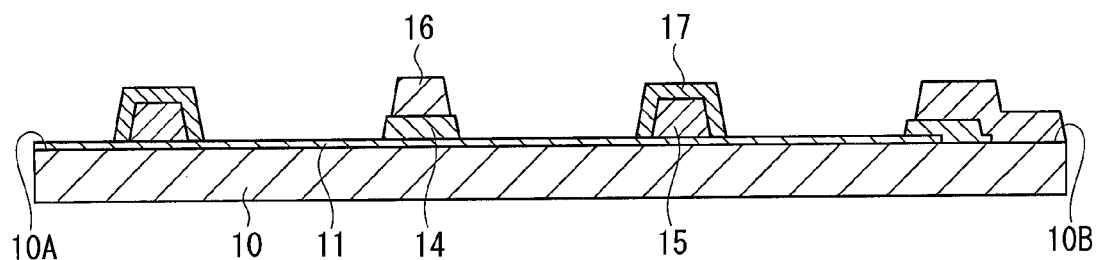
FIG. 3A is a schematic view explaining a manufacturing process after the process shown in FIG. 2D of the organic EL device according to the first exemplary embodiment, in which a process of forming a second auxiliary electrode on the first insulative portion is explained.

Subsequently, the second auxiliary electrode 16 is formed on the first insulative portion 14 as shown in FIG. 3A. Herein, a part of the second auxiliary electrode 16 is also formed on the second electrode drawing portion 10B.

A forming method of the second auxiliary electrode 16 is exemplified by the same as that of the first auxiliary electrode 15.

In the organic EL device 1, the second auxiliary electrode 16 is formed by screen printing using silver paste in the same manner as the first auxiliary electrode 15.

Figure 3B:
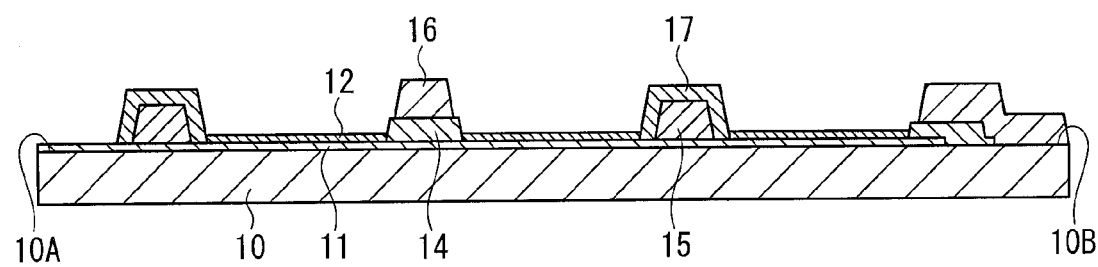
FIG. 3B is a schematic view explaining a process of forming an organic compound layer on the first electrode after the process shown in FIG. 3A.

Next, the organic compound layer 12 is formed on the first electrode 11 as shown in FIG. 3B. Herein, the thickness of the organic compound layer 12 is formed smaller than that of the first insulative portion 14.

As a forming method of the organic compound layer 12, known methods of dry film-forming such as vacuum deposition, sputtering, plasma or ion plating and wet film-forming such as spin coating, dipping, flow coating or inkjet are applicable. At this time, the organic compound layer 12 is preferably formed by masking at a predetermined position, particularly so as not to be contacted with the second auxiliary electrode 16.

Figure 3C:
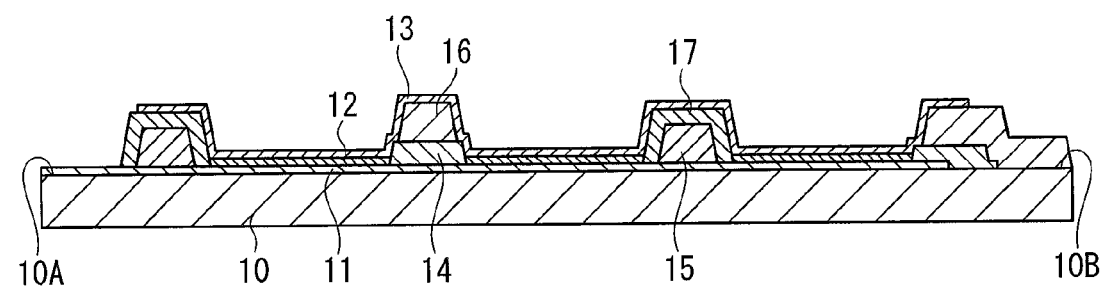
FIG. 3C is a schematic view explaining a process of forming a second electrode after the process shown in FIG. 3B.

Next, the second electrode 13 is formed on the organic compound layer 12, the second auxiliary electrode 16 and the second insulative portion 17 as shown in FIG. 3C. A material for the transparent electrode is used as the second electrode 13.

A forming method of the second electrode 13 is exemplified by the same as that of the first electrode 11.

Next, the first substrate 10 is bonded to the second substrate 18. The second substrate 18 is provided by a transparent glass substrate. Granulated glass is used as the bonding member.

Thus, the organic EL device 1 is manufactured.

Advantages of First Exemplary Embodiment

According to the above-described first exemplary embodiment, the following advantages can be obtained.

(1) In the organic EL device 1, the first auxiliary electrode 15 is in electrical continuity with the first electrode 11 while the second auxiliary electrode 16 is in electrical continuity with the second electrode 13. The first auxiliary electrode 15 and the second auxiliary electrode 16 are respectively formed of a conductive material having electric resistance lower than those of the first electrode 11 and the second electrode 13. Accordingly, a voltage decline in the first electrode 11 and the second electrode 13 (transparent electrodes) is decreased, so that unevenness of the luminance intensity in the organic EL device 1 can be inhibited.

(2) In the organic EL device 1, the organic compound layer 12 is insulated from the second auxiliary electrode 16 by the first insulative portion 14 while being insulated from the first auxiliary electrode 15 by the second insulative portion 17. In other words, since the organic compound layer 12 is not directly electrically connected to the first auxiliary electrode 15 and the second auxiliary electrode 16, both of which have a low electric resistance, unevenness of the luminance intensity in the organic EL device 1 can be inhibited.

(3) In the organic EL device 1, the thickness of the first insulative portion 14 is formed larger than the thickness of the organic compound layer 12 so that the distance between the second auxiliary electrode 16 and the first electrode 11 becomes larger than a thickness of the organic compound layer 12. Accordingly, since the organic compound layer 12 and the second auxiliary electrode 16 are not directly electrically connected to each other, unevenness of the luminance intensity in the organic EL device 1 can be inhibited.

(4) In the organic EL device 1, since the first electrode 11 is insulated from the second auxiliary electrode 16 by the first insulative portion 14 while the second electrode 13 is insulated from the first auxiliary electrode 15 by the second insulative portion 17, a short circuit of the organic EL device 1 can be prevented.

(5) In the organic EL device 1, since the first substrate 10 and the second substrate 18 are transparent substrates and the first electrode 11 and the second electrode 13 are transparent electrodes, light emitted from the organic compound layer 12 can be efficiently extracted through the first substrate 10 and the second substrate 18.

Accordingly, the organic EL device 1 is an organic EL device emitting light through both surfaces of the first substrate 10 and the second substrate 18 and further having an inhibited unevenness of luminance intensity as described in the above Advantages (1).

(6) In the organic EL device 1, the first auxiliary electrode 15 and the second auxiliary electrode 16 are formed of the conductive paste material. Accordingly, the first auxiliary electrode 15 and the second auxiliary electrode 16 are easily formable by printing or coating, so that resistance thereof is reducible.

(7) In the organic EL device 1, since the first insulative portion 14 and the second insulative portion 17 are formed of the same material, the first insulative portion 14 and the second insulative portion 17 are formable in the same process. Accordingly, the manufacturing process of the organic EL device 1 can be simplified.

Second Exemplary Embodiment

Next, a second exemplary embodiment of the invention will be described with reference to the attached drawings.

In the description of the second exemplary embodiment, the same components as those in the first exemplary embodiment are denoted by the same reference signs to simplify or omit an explanation of the components.

Figure 4:
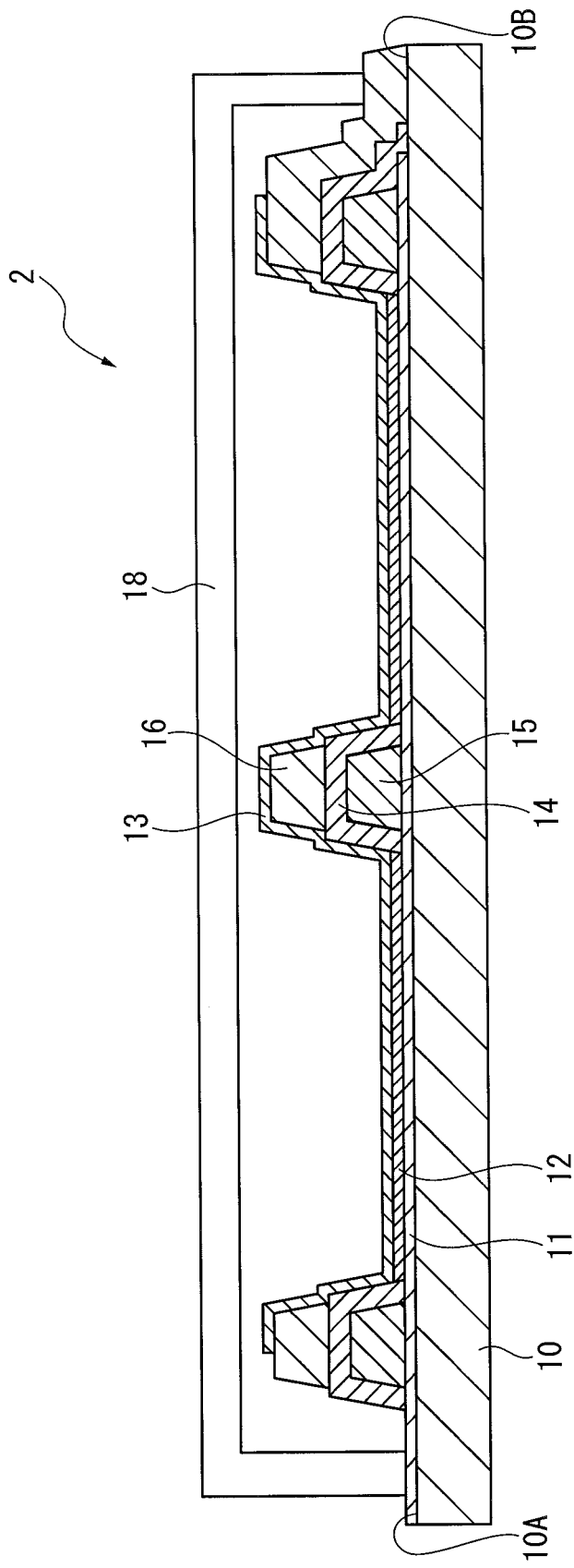
FIG. 4 is a cross-sectional view of an organic EL device according to a second exemplary embodiment.

FIG. 4 is a cross-sectional view along a thickness direction of a substrate of an organic EL device 2 according to a second exemplary embodiment of the invention.

The organic EL device 2 is different from the organic EL device 1 of the first exemplary embodiment in positions where the first auxiliary electrode 15 and the second auxiliary electrode 16 are formed. Specifically, the first auxiliary electrode 15 and the second auxiliary electrode 16 are alternately disposed along the surface of the first substrate 10 in the organic EL device 1 as shown in FIG. 1, whereas the first auxiliary electrode 15 and the second auxiliary electrode 16 are positioned to face each other across the first insulative portion 14 in the organic EL device 2 as shown in FIG. 4. Other components of the organic EL device 2 are formed of the same materials and members as those of the organic EL device 1.

As described above, the first auxiliary electrode 15 and the second auxiliary electrode 16 are positioned to face each other across the first insulative portion 14 in the organic EL device 2. Accordingly, the first auxiliary electrode 15 is formed on the first electrode 11, the first insulative portion 14 is formed to cover the first auxiliary electrode 15, and the second auxiliary electrode 16 is formed on the first insulative portion 14.

Also in the organic EL device 2, a distance between the second auxiliary electrode 16 and the first electrode 11 is preferably larger than the thickness of the organic compound layer. In view of this, the total of the thickness of the first insulative portion 14 and the thickness of the first auxiliary electrode 15 is formed larger than the thickness of the organic compound layer in the organic EL device 2. With thus defined relationship in thickness, the distance between the second auxiliary electrode 16 and the first electrode 11 becomes larger than the thickness of the organic compound layer 12. Herein, the organic compound layer 12 is not in contact with the second auxiliary electrode 16 formed on the first insulative portion 14, whereby the organic compound layer 12 is not electrically connected to the second auxiliary electrode 16.

Manufacturing Process of Organic EL Device

Next, a manufacturing method of the organic EL device 2 will be described with reference to drawings. Since the manufacturing method of the organic EL device 2 is substantially the same as that of the organic EL device 1, the description of the manufacturing method of the organic EL device 2 omitted or simplified. Particular differences from the organic EL device 1 will be described in detail.

Figure 5A:
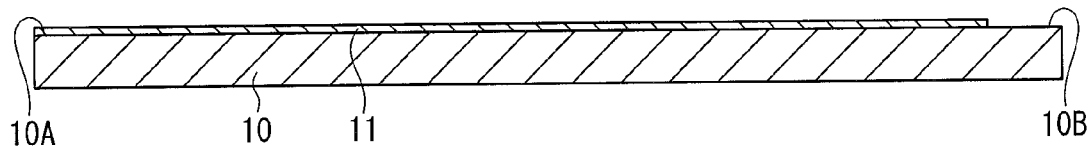
FIG. 5A is a schematic view explaining a manufacturing process of the organic EL device according to the second exemplary embodiment, in which a process of forming the first electrode on the first substrate is explained.

Firstly, the first electrode 11 is formed on the first substrate 10 as shown in FIG. 5A. Herein, the first electrode 11 is also formed on the first electrode drawing portion 10A.

Figure 5B:
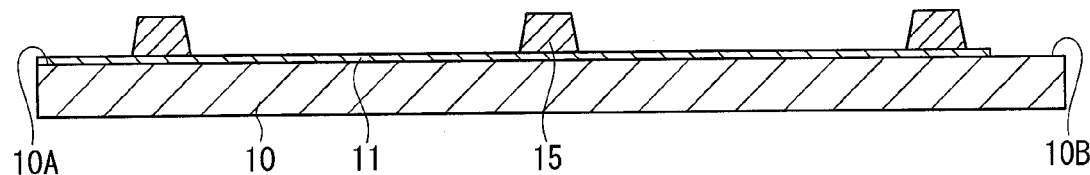
FIG. 5B is a schematic view explaining a process of forming the first auxiliary electrode on the first electrode after the process shown in FIG. 5A.

Next, the first auxiliary electrode 15 is formed on the first electrode 11 as shown in FIG. 5B.

Figure 5C:
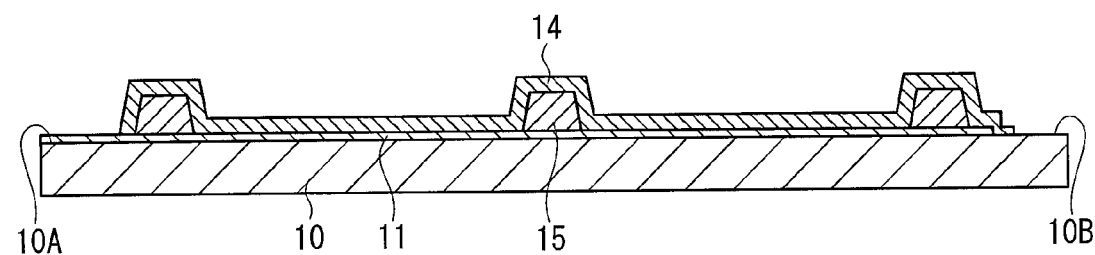
FIG. 5C is a schematic view explaining a process of forming the first insulative portion after the process shown in FIG. 5B.
Figure 5D:
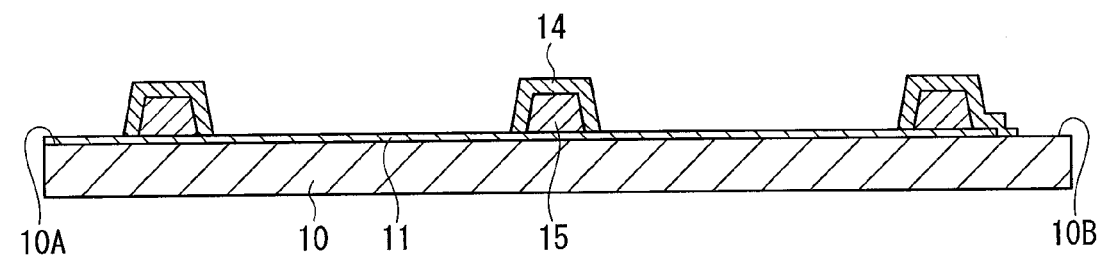
FIG. 5D is a schematic view explaining another process of forming the first insulative portion after the process shown in FIG. 5C.

The first insulative portion 14 is formed on the first electrode 11 and the first auxiliary electrode 15 as shown in FIG. 5C. In the organic EL device 2, since an insulative portion corresponding to the second insulative portion 17 is not formed, a portion at which the first insulative portion 14 is not to be formed is irradiated with light (exposed to light) using a mask having a predetermined shape to cover the first auxiliary electrode 15. When the initially obtained first insulative portion 14 exposed to light is developed by a developing solution, the photoresist material remains on the part not irradiated with light, so that the resultant first insulative portion 14 is formed as shown in FIG. 5D.

Figure 6A:
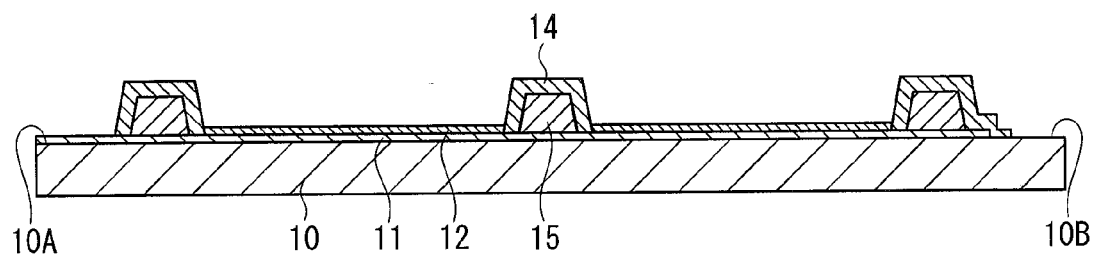
FIG. 6A is a schematic view explaining a manufacturing process after the process shown in FIG. 5 of the organic EL device according to the second exemplary embodiment, in which a process of forming the organic compound layer on the first insulative portion is explained.

Next, the organic compound layer 12 is formed on the first electrode 11 as shown in FIG. 6A. Herein, the thickness of the organic compound layer 12 is formed smaller than the total of the thickness of the first insulative portion 14 and the thickness of the first auxiliary electrode 15.

Figure 6B:
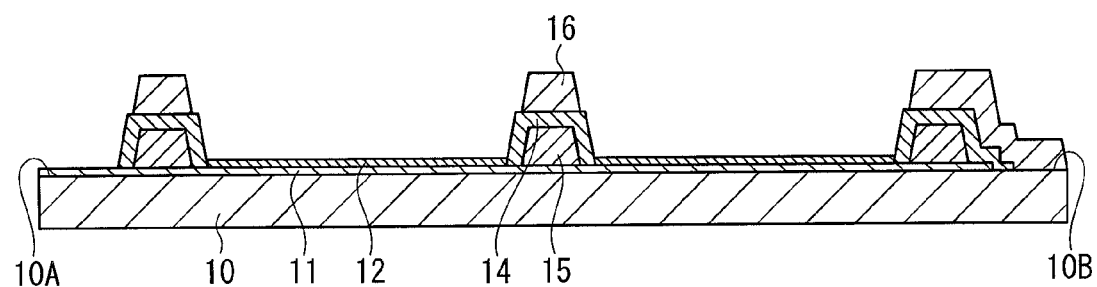
FIG. 6B is a schematic view explaining a process of forming the second auxiliary electrode on the first insulative portion after the process shown in FIG. 6A.

Subsequently, the second auxiliary electrode 16 is formed on the first insulative portion 14 as shown in FIG. 6B. Herein, a part of the second auxiliary electrode 16 is also formed on the second electrode drawing portion 10B.

Figure 6C:
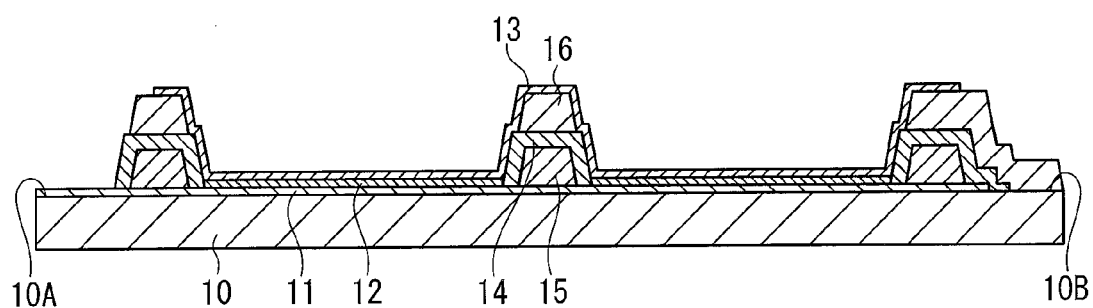
FIG. 6C is a schematic view explaining a process of forming the second electrode after the process shown in FIG. 6B.

Then, the second electrode 13 is formed on the organic compound layer 12, the second auxiliary electrode 16 and the first insulative portion 14 as shown in FIG. 6C.

Next, the first substrate 10 is bonded to the second substrate 18.

Thus, the organic EL device 2 is manufactured.

According to the second exemplary embodiment, in addition to the same advantages as the advantages (1), (5) to (7) according to the first exemplary embodiment, the following advantages are obtained.

(8) The first auxiliary electrode 15 and the second auxiliary electrode 16 are positioned to face each other across the first insulative portion 14 in the organic EL device 2. In other words, when the organic EL device 2 is seen in a plan view in the thickness direction of the first substrate 10, the second auxiliary electrode 16 is formed to be layered on the first auxiliary electrode 15. Accordingly, as compared with the arrangement of the organic EL device 1 in which the auxiliary electrodes 15 and 16 are alternately formed against the first electrode 11 and the second electrode 13, the aperture ratio of the organic EL device 2 can be improved.

(9) In the organic EL device 2, the organic compound layer 12 is insulated from the second auxiliary electrode 16 and the first auxiliary electrode 15 by the first insulative portion 14. In other words, since the organic compound layer 12 is not directly electrically connected to the first auxiliary electrode 15 and the second auxiliary electrode 16, both of which has a low electric resistance, unevenness of the luminance intensity in the organic EL device 2 can be inhibited.

(10) The total of the thickness of the first insulative portion 14 and the thickness of the first auxiliary electrode 15 is formed larger than the thickness of the organic compound layer 12 in the organic EL device 2. Accordingly, the distance between the second auxiliary electrode 16 and the first electrode 11 becomes larger than the thickness of the organic compound layer 12. Consequently, since the organic compound layer 12 and the second auxiliary electrode 16 are not directly electrically connected to each other, unevenness of the luminance intensity in the organic EL device 2 can be inhibited.

(11) In the organic EL device 2, since the first electrode 11 is insulated from the second auxiliary electrode 16 by the first insulative portion 14 while the second electrode 13 is insulated from the first auxiliary electrode 15 by the first insulative portion 14, a short circuit of the organic EL device 2 can be prevented.

Third Exemplary Embodiment

Next, a third exemplary embodiment of the invention will be described with reference to the attached drawings.

In the description of the third exemplary embodiment, the description of the same components as those in the first exemplary embodiment is omitted or simplified.

Figure 7:
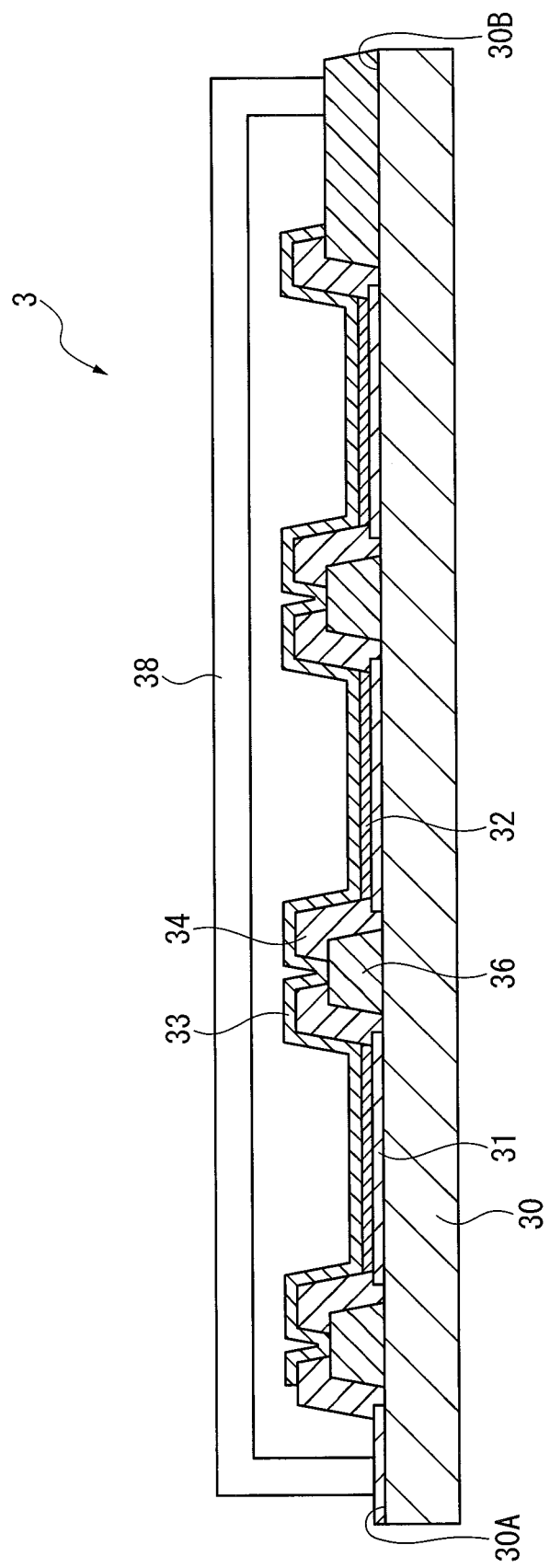
FIG. 7 is a cross-sectional view of an organic EL device according to a third exemplary embodiment.

FIG. 7 is a cross-sectional view along a thickness direction of a substrate of an organic EL device 3 according to a third exemplary embodiment of the invention.

The organic EL device 3 is different from the organic EL device 1 of the first exemplary embodiment in a position where the second auxiliary electrode in electrical continuity with the second electrode is formed. Specifically, the second auxiliary electrode 16 is formed between the first electrode 11 and the second electrode 13 in the organic EL device 1 as shown in FIG. 1, whereas a second auxiliary electrode 36 is formed on a first substrate 30 in the organic EL device 3 as shown in FIG. 7. Other components of the organic EL device 3 are formed of the same materials and members as those of the organic EL device 1. For the sake of confirmation, the later-described first substrate 30, first electrode 31, organic compound layer 32, second electrode 33, first insulative portion 34, second auxiliary electrode 36 and second substrate 38 of the organic EL device 3 respectively correspond to the first substrate 10, first electrode 11, organic compound layer 12, second electrode 13, first insulative portion 14, second auxiliary electrode 16 and second substrate 18 of the organic EL device 1. Each of the components of the organic EL device 3 is made of the same material as the corresponding component of the organic EL device 1.

In the organic EL device 3, no auxiliary electrode for the first electrode 31 is formed. Accordingly, it is preferable that the first electrode 31 is provided by a light-transmissive thin-film metal layer to inhibit voltage decline of the first electrode 31. In this arrangement, a thickness of the first electrode 31 is preferably in a range of 3 nm to 15 nm, a light transmittance of the first electrode 31 in a visible region is preferably more than 40%, and a sheet resistance of the first electrode 31 is preferably 20 Ω/sq. or less. Preferable examples of metals used for the thin-film metal layer are silver, silver alloys, gold alloys, Al and Al alloys. When the alloys are used, preferable metals except for primary metals are transitional metals such as Pd, Ni, Nb, W and Ti and rare earth metals such as Sm, Yb and Hf.

On the first substrate 30 of the organic EL device 3, the first electrode drawing portion 30A and the second electrode drawing portion 30B are formed in the same manner as in the first exemplary embodiment.

The first electrode 31 of the organic EL device 3 is formed on the first substrate 30. Herein, the first electrode 31 is not formed over the entire surface of the first substrate 30, but formed with space for forming the second auxiliary electrode 36. For instance, when the organic EL device 3 is seen in a plan view in the thickness direction of the first substrate 30, the first electrode 31 is formed in a comb shape.

The second auxiliary electrode 36 of the organic EL device 3 is formed on the first substrate 30. The second auxiliary electrode 36 is formed in the space formed on the first substrate 30 as described above with a predetermined gap from the first electrode 31 to avoid electric continuity with the first electrode 31.

The second auxiliary electrode 36 is formed of a material having electric resistance lower than that of the second electrode 33. In the organic EL device 3, the second auxiliary electrode 36 is formed of a conductive paste material by printing or coating.

In the organic EL device 3, although an auxiliary electrode corresponding to the first auxiliary electrode 15 and an insulative portion corresponding to the second insulative portion 17 in the organic EL device 1 are not formed, an auxiliary electrode may be formed on the first electrode 31 and an insulative portion may be formed to cover this auxiliary electrode in the same manner as in the organic EL device 1.

The first insulative portion 34 of the organic EL device 3 is formed between the first electrode 31 and the second auxiliary electrode 36. As described above, since the first electrode 31 and the second auxiliary electrode 36 are formed on the first substrate 30 with a predetermined gap, the first insulative portion 34 is formed so as to fill the gap.

The organic compound layer 32 of the organic EL device 3 is formed on the first electrode 31. The first insulative portion 34 is formed between the organic compound layer 32 and the second auxiliary electrode 36.

The second electrode 33 of the organic EL device 3 is formed on the organic compound layer 32, the first insulative portion 34 and the second auxiliary electrode 36.

The second substrate 38 of the organic EL device 3 is disposed to face the first substrate 30 and is bonded to the first substrate 30 by a bonding member (not shown). The organic compound layer 32 is housed between the second substrate 38 and the first substrate 30 mutually bonded, whereby the organic compound layer 32 is sealed.

According to the third exemplary embodiment, in addition to the same advantages as the advantages (5) and (6) according to the first exemplary embodiment, the following advantages are obtained.

(12) In the organic EL device 3, the second auxiliary electrode 36 is formed not on the first electrode 31 but on the first substrate 30. Accordingly, a pressure for forming the second auxiliary electrode 36 of a conductive paste material by printing or coating is not applied on the first electrode 31. Consequently, since the first electrode 31 is prevented from being damaged, the organic EL device 3 can emit light more evenly.

(13) In the organic EL device 3, the second auxiliary electrode 36 is in electrical continuity with the second electrode 13. The second auxiliary electrode 36 is formed of a conductive material having electric resistance lower than that of the second electrode 33. Accordingly, a voltage decline in the second electrode 33 is decreased, so that unevenness of the luminance intensity of the organic EL device 3 can be inhibited.

(14) In the organic EL device 3, the organic compound layer 32 is insulated from the second auxiliary electrode 36 by the first insulative portion 34. In other words, since the organic compound layer 32 is not directly electrically connected to the second auxiliary electrode 36 having a low electric resistance, unevenness of the luminance intensity in the organic EL device 3 can be inhibited.

(15) In the organic EL device 3, since the first electrode 31 is insulated from the second auxiliary electrode 36 by the first insulative portion 34, a short circuit of the organic EL device 3 can be prevented.

Fourth Exemplary Embodiment

Next, a fourth exemplary embodiment of the invention will be described with reference to the attached drawings.

In the description of the fourth exemplary embodiment, the description of the same components as those in the first exemplary embodiment is omitted or simplified.

Figure 8:
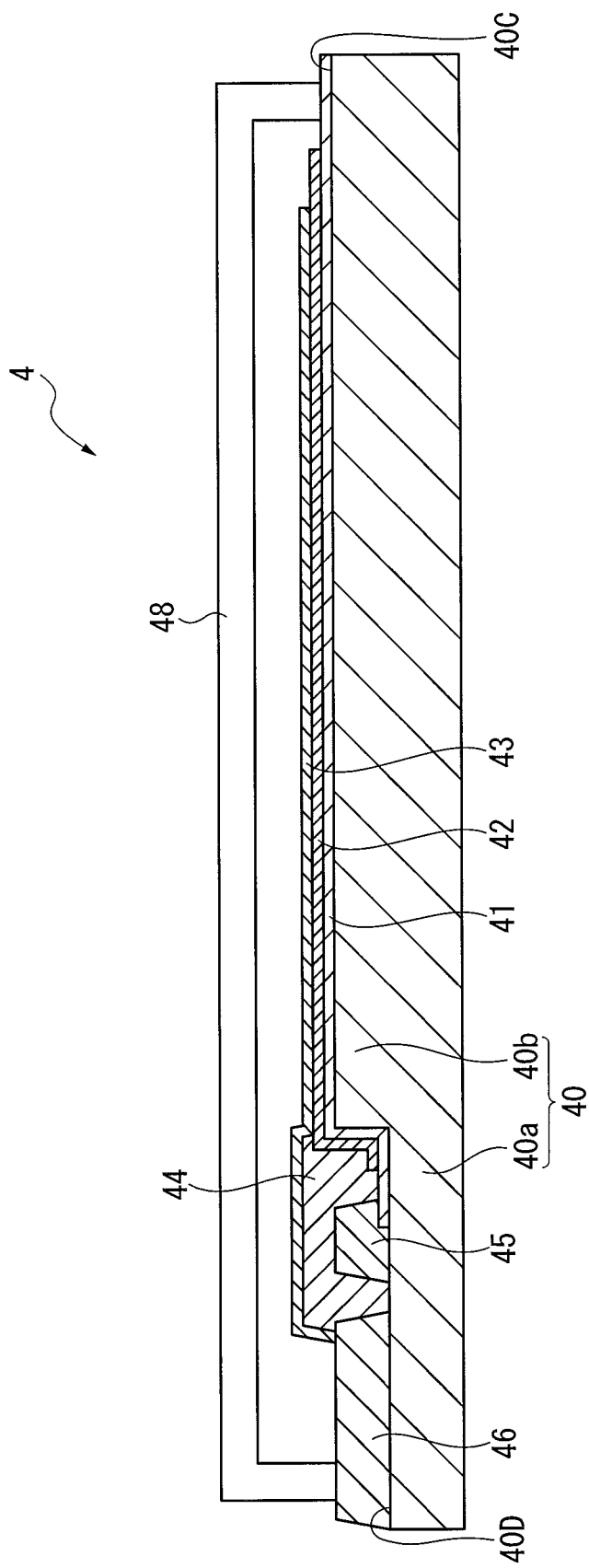
FIG. 8 is a cross-sectional view of an organic EL device according to a fourth exemplary embodiment.

FIG. 8 is a cross-sectional view along a thickness direction of a substrate of an organic EL device 4 according to a fourth exemplary embodiment of the invention.

The organic EL device 4 is different from the organic EL device 1 of the first exemplary embodiment in a shape of the first substrate and positions where the first auxiliary electrode in electrical continuity with the first electrode and the second auxiliary electrode in electrical continuity with the second electrode are formed.

Specifically, the shape of the first substrate 10 of the organic EL device 1 is a flat plate as shown in FIG. 1, whereas a first substrate 40 of the organic EL device 4 has a step as shown in FIG. 8.

Moreover, the first auxiliary electrode 15 and the second auxiliary electrode 16 are formed between the first electrode 11 and the second electrode 13 in the organic EL device 1 as shown in FIG. 1, whereas a first auxiliary electrode 45 and a second auxiliary electrode 46 are formed on a lower surface of the step of the first substrate 40 in the organic EL device 4 as shown in FIG. 8. Other components of the organic EL device 4 are formed of the same materials and members as those of the organic EL device 1. For the sake of confirmation, the later-described first substrate 40, first electrode 41, organic compound layer 42, second electrode 43, insulative portion 44, first auxiliary electrode 45, second auxiliary electrode 46 and second substrate 48 of the organic EL device 4 respectively correspond to the first substrate 10, first electrode 11, organic compound layer 12, second electrode 13, first insulative portion 14, first auxiliary electrode 15, second auxiliary electrode 16 and second substrate 18 of the organic EL device 1. Each of the components of the organic EL device 4 is made of the same material as the corresponding component of the organic EL device 1.

The first substrate 40 of the organic EL device 4 includes a body 40a shaped in a flat plate and a protrusion 40b that perpendicularly projects from a surface of the body 40a. Accordingly, the first substrate 40 having a step is formed with a convex cross section as shown in FIG. 8.

In the first substrate 40, the body 40a and the protrusion 40b are preferably formed of different members. Since the body 40a and the protrusion 40b are formed of different members, it is not necessary to form the body 40ba and the protrusion 40b by processing a single member and it is only necessary to bond the member of the body 40a to the member of the protrusion 40b, so that the first substrate 40 is easily manufactured at a low manufacturing cost.

The member of the protrusion 40b is smaller than the member of body 40a in size, thereby securing a surface on which the later-described first auxiliary electrode 45 and the like are formed when both of the members are bonded. The thickness of both the members is defined so that a height of the first auxiliary electrode 45 is more than a height of the protrusion 40b, and it is preferable that the protrusion 40b and the first auxiliary electrode 45 are formed close to or in contact with each other since the first auxiliary electrode 45 and the first electrode 41 are reliably connectable to each other.

Examples of a material for the member of the protrusion 40b are a polymer material and an inorganic paste material. Such materials are preferable since various printing and coating methods are applicable. Preferable examples of the polymer material are acrylate, polycarbonate, polystyrene, polyolefin, polyimide, polysulphone polyester, epoxy resin, phenol resin, silicon resin and fluorine resin. These polymer materials may be provided by a composite polymer material containing inorganic fine particles, inorganic nano particles, inorganic filler and the like. The inorganic paste material may also include a composite polymer material or mean a material in which organic substances are granulated after calcination.

In the first substrate 40 of the organic EL device 4, a first electrode drawing portion 40C is formed on the protrusion 40b, and a second electrode drawing portion 40D is formed on the body 40a, as shown in FIG. 8.

The first electrode 41 of the organic EL device 4 is formed on the protrusion 40b of the first substrate 40. Specifically, the first electrode 41 is formed on an upper surface of the step of the first substrate 40.

The first auxiliary electrode 45 of the organic EL device 4 is formed at a position close to the step and on the same surface of the body 40a of the first substrate 40 as the surface on which the protrusion 40b is formed.

The first auxiliary electrode 45 is formed of a material having electric resistance lower than that of the first electrode 41. In the organic EL device 4, the first auxiliary electrode 45 is formed of a conductive paste material by printing or coating.

Electrical continuity between the first auxiliary electrode 45 and the first electrode 41 is established. In the organic EL device 4, the first electrode 41 formed on the protrusion 40b extends over to the surface of body 40a where the first auxiliary electrode 45 is formed as shown in FIG. 8. The first auxiliary electrode 45 is formed so as to cover a part of the extended portion of the first electrode 41.

The second auxiliary electrode 46 of the organic EL device 4 is formed at a position remote from the step relative to the first auxiliary electrode 45 and on the same surface of the body 40a of the first substrate 40 as the surface on which the first auxiliary electrode 45 is formed. The second auxiliary electrode 46 and the first auxiliary electrode 45 are space apart with a predetermined gap so as to avoid electrical continuity therebetween.

Electrical continuity between the second auxiliary electrode 46 and the second electrode 43 is established.

The second auxiliary electrode 46 is also formed in the same manner as the first auxiliary electrode 45. The first auxiliary electrode 45 and the second auxiliary electrode 46 may be formed at the same time.

The organic compound layer 42 of the organic EL device 4 is formed on the first electrode 41. In the organic EL device 4, as shown in FIG. 8, the organic compound layer 42 also extends over to the extended portion of the first electrode 41 and the insulative portion 44 is interposed between the extended portion of the organic compound layer 42 and the first auxiliary electrode 45. Accordingly, the organic compound layer 42 is not directly electrically connected to the first auxiliary electrode 45.

The insulative portion 44 of the organic EL device 4 is formed between the first auxiliary electrode 45 and the second auxiliary electrode 46. As described above, since the first auxiliary electrode 45 and the second auxiliary electrode 46 are formed on the body 40a of the first substrate 40 with a predetermined gap, the insulative portion 44 is formed so as to fill the gap.

The insulative portion 44 is formed between the second auxiliary electrode 46 and the first electrode 41, between the second auxiliary electrode 46 and the organic compound layer 42, and between the first electrode 41 and the second electrode 43 to insulate therebetween.

The second electrode 43 of the organic EL device 4 is formed on the organic compound layer 42, the insulative portion 44 and the second auxiliary electrode 46.

Electrical continuity between the second electrode 43 and the second auxiliary electrode 46 is established.

The second substrate 48 of the organic EL device 4 is disposed to face the first substrate 40 and is bonded to the first substrate 40 by a bonding member (not shown). The organic compound layer 42 is housed between the second substrate 48 and the first substrate 40 mutually bonded, whereby the organic compound layer 42 is sealed.

According to the fourth exemplary embodiment, in addition to the same advantages as the advantages (1), (5) and (6) according to the first exemplary embodiment, the following advantages are obtained.

(16) In the organic EL device 4, the first auxiliary electrode 45 and the second auxiliary electrode 46 are formed not on the first electrode 41 but on the body 40a of the first substrate 40. Accordingly, a pressure for forming the first auxiliary electrode 45 and the second auxiliary electrode 46 of a conductive paste material by printing or coating is not applied on the first electrode 41. Consequently, since the first electrode 41 is prevented from being damaged, the organic EL device 4 can emit light more evenly.

Particularly, since the protrusion 40b on which the first electrode 41 is formed is remotely located from the body 40a on which the first auxiliary electrode 45 and the second auxiliary electrode 46 are formed with the step being interposed between the body 40a and the protrusion 40b, application of a pressure on the first electrode 41 can be more reliably prevented.

(17) In the organic EL device 4, since the first auxiliary electrode 45 and the second auxiliary electrode 46 are not formed on the first electrode 41 as described above, the aperture ratio is improved.

(18) In the organic EL device 4, the organic compound layer 42 is insulated from the first auxiliary electrode 45 and the second auxiliary electrode 46 by the insulative portion 44. In other words, since the organic compound layer 42 is not directly electrically connected to the first auxiliary electrode 45 and the second auxiliary electrode 46, both of which has a low electric resistance, unevenness of the luminance intensity in the organic EL device 4 can be inhibited.

(19) In the organic EL device 4, since the first electrode 41 is insulated from the second auxiliary electrode 46 by the insulative portion 44, the second electrode 43 is insulated from the first auxiliary electrode 45 by the insulative portion 44, and the first auxiliary electrode 45 is insulated from the second auxiliary electrode 46 by the insulative portion 44, a short circuit of the organic EL device 4 can be prevented.

Fifth Exemplary Embodiment

Next, a fifth exemplary embodiment of the invention will be described with reference to the attached drawings.

In the description of the fifth exemplary embodiment, the description of the same components as those in the first exemplary embodiment is omitted or simplified.

Figure 9:
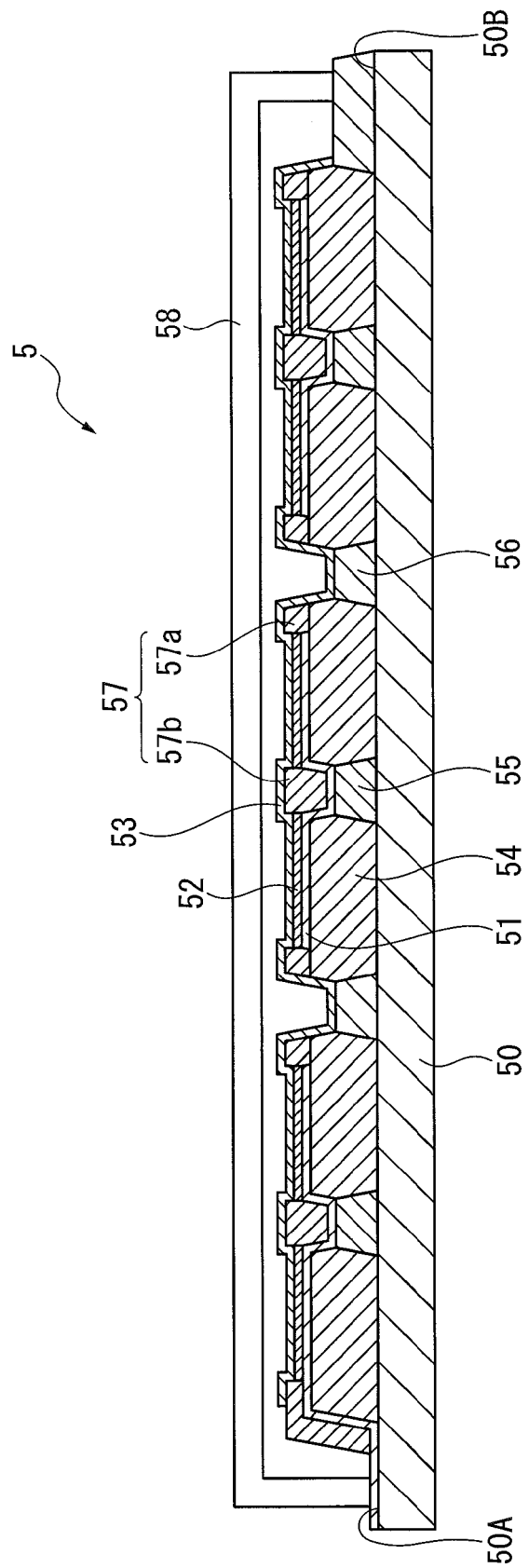
FIG. 9 is a cross-sectional view of an organic EL device according to a fifth exemplary embodiment.

FIG. 9 is a cross-sectional view along a thickness direction of a substrate of an organic EL device 5 according to the fifth exemplary embodiment of the invention.

The organic EL device 5 is different from the organic EL device 1 of the first exemplary embodiment in positions where the first auxiliary electrode and the second auxiliary electrode are formed. Further, the organic EL device 5 is different from the organic EL device 1 in a position where the first electrode is formed.

Specifically, the former difference is that the first auxiliary electrode 15 and the second auxiliary electrode 16 are formed between the first electrode 11 and the second electrode 13 in the organic EL device 1 as shown in FIG. 1, whereas a first auxiliary electrode 55 and a second auxiliary electrode 56 are formed on a first substrate 50 in the organic EL device 5 as shown in FIG. 9.

The latter difference is that the first electrode 11 is formed on the first substrate 10 in the organic EL device 1 as shown in FIG. 1, whereas a first insulative portion 54 is formed on the first substrate 50 and a first electrode 51 is formed on the first insulative portion 54 in the organic EL device 5 as shown in FIG. 9.

Other components of the organic EL device 5 are formed of the same materials and members as those of the organic EL device 1. For the sake of confirmation, the later-described first substrate 50, first electrode 51, organic compound layer 52, second electrode 53, first insulative portion 54, first auxiliary electrode 55, second auxiliary electrode 56, second insulative portion 57 and second substrate 58 of the organic EL device 5 respectively correspond to the first substrate 10, first electrode 11, organic compound layer 12, second electrode 13, first insulative portion 14, first auxiliary electrode 15, second auxiliary electrode 16, second insulative portion 17 and second substrate 18 of the organic EL device 1. Each of the components of the organic EL device 5 is made of the same material as the corresponding component of the organic EL device 1.

Unlike the aforementioned exemplary embodiments, in the organic EL device 5, the first insulative portion 54 is formed on the first substrate 50.

Herein, the first insulative portion 54 is not formed over the entire surface of the first substrate 50, but formed on the first substrate 50 with a gap as shown in FIG. 9. Specifically, the first insulative portion 54 is formed with space for the first electrode 51 and the second electrode 53 to be electrically connected to the respective first and second auxiliary electrodes 55 and 56 formed on the first substrate 50.

A thickness of the first insulative portion 54 is formed larger than a thickness of each of the first and second auxiliary electrodes 55 and 56.

On the first substrate 50 of the organic EL device 5, a first electrode drawing portion 50A and a second electrode drawing portion 50B are formed in the same manner as in the first exemplary embodiment.

The first and second auxiliary electrodes 55 and 56 of the organic EL device 5 are formed on the first substrate 50. In the organic EL device 5, as shown in FIG. 9, the first and second auxiliary electrodes 55 and 56 are formed in a predetermined gap between the first insulative portions 54. Thus, the first insulative portion 54 is interposed between the first auxiliary electrode 55 and the second auxiliary electrode 56 to insulate the first auxiliary electrode 55 from the second auxiliary electrode 56.

The first auxiliary electrode 55 and the second auxiliary electrode 56 are formed of a material having a low electric resistance lower than those of the first electrode 51 and the second electrode 53. In the organic EL device 5, the first auxiliary electrode 55 and the second auxiliary electrode 56 are formed of a conductive paste material by printing or coating.

In the organic EL device 5, since the first insulative portion 54 is formed after the first auxiliary electrode 55 and the second auxiliary electrode 56 are formed on the first substrate 50, a part of the first insulative portion 5 partially covers the first auxiliary electrode 55 and the second auxiliary electrode 56 as shown in FIG. 9.

The first electrode 51 of the organic EL device 5 is formed on the first insulative portion 54. The first electrode 51 formed on the first insulative portion 54 extends to the first auxiliary electrode 55 along lateral sides of the first insulative portion 54, so that electrical continuity between the first electrode 51 and the first auxiliary electrode 55 is established.

The organic compound layer 52 of the organic EL device 5 is formed on the first electrode 51.

The second electrode 53 of the organic EL device 5 is formed on the organic compound layer 52. The second electrode 53 formed on the organic compound layer 52 extends to the second auxiliary electrode 56 along the lateral sides of the first insulative portion 54, so that electrical continuity between the second electrode 53 and the second auxiliary electrode 56 is established.

The second insulative portion 57 of the organic EL device 5 is formed between the first electrode 51 and the second electrode 53. The second insulative portion 57 includes a first portion 57a and a second portion 57b that are different in the position to be provided.

As shown in FIG. 9, the first portion 57a is provided under the second electrode 53 extending to the second auxiliary electrode 56 so as to be in electrical continuity with the second auxiliary electrode 56.

As shown in FIG. 9, the second portion 57b is formed at a position where the first electrode 51 is in electrical continuity with the first auxiliary electrode 55. Herein, since the first insulative portion 54 is formed to have a predetermined gap from another first insulative portion 54, the gap between the first insulative portions 54 is a hollow as shown in FIG. 9. The second portion 57b is formed to fill the hollow. The second electrode 53 is electrically connected with an adjacent second electrode 53 provided on the adjacent first insulative portion 54 through the second portion 57b.

The second substrate 58 of the organic EL device 5 is disposed to face the first substrate 50 and is bonded to the first substrate 50 by a bonding member (not shown). The organic compound layer 52 is housed between the second substrate 58 and the first substrate 50 mutually bonded, whereby the organic compound layer 52 is sealed.

According to the fifth exemplary embodiment, in addition to the same advantages as the advantages (1), (5) and (6) according to the first exemplary embodiment, the following advantages are obtained.

(20) In the organic EL device 5, the first auxiliary electrode 55 and the second auxiliary electrode 56 are formed not on the first electrode 51 but on the first substrate 50. Accordingly, a pressure for forming the first auxiliary electrode 55 and the second auxiliary electrode 56 of a conductive paste material by printing or coating is not applied on the first electrode 51. Consequently, since the first electrode 51 is prevented from being damaged, the organic EL device 5 can emit light more evenly.

(21) In the organic EL device 5, the thickness of the first insulative portion 54 is formed larger than the thickness of each of the first and second auxiliary electrodes 55 and 56. Accordingly, the organic compound layer 52 formed on the first insulative portion 54 through the first electrode 51 is positioned remote from the first auxiliary electrode 55 and the second auxiliary electrode 56 on the first substrate 50. In other words, since the organic compound layer 52 is not directly electrically connected to the first auxiliary electrode 55 and the second auxiliary electrode 56, both of which has a low electric resistance, unevenness of the luminance intensity in the organic EL device 5 can be inhibited.

(22) In the organic EL device 5, since the first auxiliary electrode 55 is insulated from the second auxiliary electrode 56 by the first insulative portion 54 while the first electrode 51 is insulated from the second electrode 53 by the second insulative portion 57, a short circuit of the organic EL device 5 can be prevented.

Sixth Exemplary Embodiment

Next, a sixth exemplary embodiment of the invention will be described with reference to the attached drawings.

In the description of the sixth exemplary embodiment, the description of the same components as those in the first exemplary embodiment is omitted or simplified.

Figure 10:
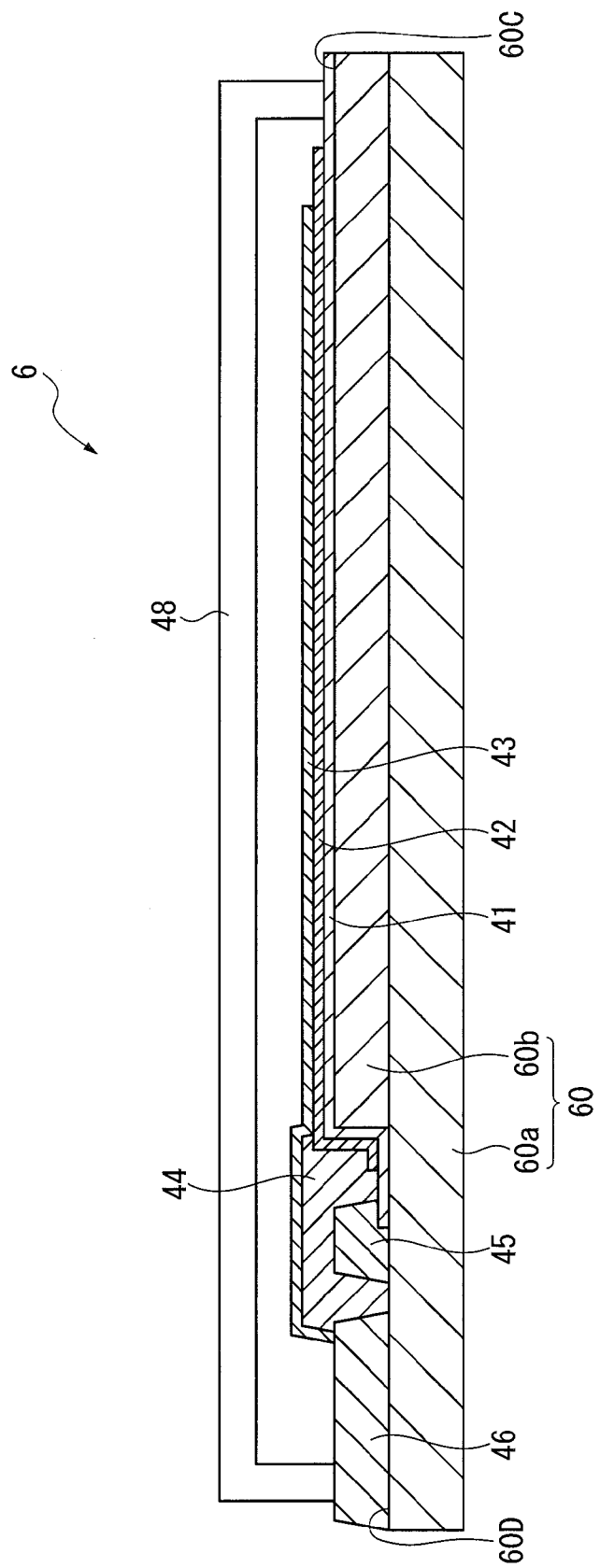
FIG. 10 is a cross-sectional view of an organic EL device according to a sixth exemplary embodiment.

FIG. 10 is a cross-sectional view along a thickness direction of a substrate of an organic EL device 4 according to a fourth exemplary embodiment of the invention.

An organic EL device 6 is different from the organic EL device 4 of the fourth exemplary embodiment in an arrangement of the protrusion of the first substrate. A first substrate 60 of the organic EL device 6 has a step in the same manner as the first substrate 40 of the organic EL device 4 and includes a body 60a and a protrusion 60b. In the exemplary embodiment, the protrusion 60b is formed as a light extraction layer on the body 60a shaped in a flat plate.

The protrusion 60b as the light extraction layer is preferably formed of a material having a high refractive index. The refractive index of the protrusion 60b is preferably in a range from 1.5 to 2.5.

In the first substrate 60 of the organic EL device 6, a first electrode drawing portion 60C is formed on the protrusion 60b, and a second electrode drawing portion 60D is formed on the body 60a as shown in FIG. 10.

In order to form a light extraction layer having a high refractive index, for instance, a high-refractive-index material in which fine particles having a high refractive index are dispersed in a matrix material is used to form a film on a surface of the body 60a. The fine particles having a high refractive index are, for instance, fine particles of an inorganic oxide such as titania and zirconia. The matrix material is, for instance, a transparent resin.

A surface of the protrusion 60b is preferably formed flat. Since the first electrode 41, organic compound layer 42 and second electrode 43 are laminated on the protrusion 60b, forming the surface of the protrusion 60b (an under layer) to be flat prevents a short circuit between the electrodes. Film formation of the protrusion 60b is conducted by wet film-forming or the like. Specifically, for instance, a highly refractive material in a form of ink by using a solvent is coated on the surface of the body 60a using spin coating, and then, the solvent is evaporated and dried to form a film.

According to the sixth exemplary embodiment, in addition to the same advantages as in the fourth exemplary embodiment, the following advantages are obtained.

Since the protrusion 60b of the first substrate 60 is provided as a light extraction layer, irradiation generated in the organic compound layer 42 can be efficiently extracted from the first substrate 60.

Modification(s)

It should be noted that the invention is not limited to the above exemplary embodiment but may include any modification and improvement as long as such modification and improvement are compatible with an object of the invention. It should be noted that the invention may include the following modifications as long as such modifications are compatible with an object of the invention.

In the above exemplary embodiments, the organic EL devices are described in the arrangement in which emission from the organic compound layer is extracted from the organic compound layer through both the first and second substrates. However, emission of the organic EL device may be extracted from one of the substrates. In this arrangement, a substrate from which emission is not extracted and an electrode disposed near the substrate may not be made of a transparent material.

A heat-radiation member may be fed in an inner space formed by bonding of the first and second substrates. The heat-radiation member serves for efficiently transmitting heat generated in the organic EL device toward the substrate. For instance, with reference to the organic EL device 1, the heat-radiation member may be fed in space between the second electrode 13 and the second substrate 18. The heat-radiation member is preferably an inactive member having a favorable heat conductivity, an example of which may be fluorine oil.

In the above exemplary embodiments, a concave portion is formed in the second substrate. However, the second substrate may be a flat plate. In this arrangement, in order that the organic compound layer and the like are not crushed between the substrates, a spacer for keeping a distance between the first substrate and the second substrate may be disposed. Alternatively, the above bonding member may be formed thicker to serve as a spacer.

In the above exemplary embodiments, the arrangement where a positive photoresist material containing an electrically insulative resin is used as an electrically insulative material is described. However, a negative photoresist material may be used or a thermosetting resist material containing an electrically insulative resin may be used.

The invention claimed is:

1. An organic electroluminescence device comprising:
a first substrate;
a first electrode;
an organic compound layer;
a second electrode, the first substrate, the first electrode, the organic compound layer and the second electrode being disposed in this sequence;
a first insulative portion and a second auxiliary electrode formed between the first electrode and the second electrode in this sequence from the first electrode; and
a first auxiliary electrode formed between the first electrode and the first insulative portion, wherein
the second electrode is in electrical continuity with the second auxiliary electrode,
the first electrode and the organic compound layer are insulated from the second auxiliary electrode by the first insulative portion,
the first electrode is in electrical continuity with the first auxiliary electrode, and
the organic compound layer is insulated from the first auxiliary electrode by the first insulative portion.

2. An organic electroluminescence device comprising:
a first substrate;
a first electrode;
an organic compound layer;
a second electrode, the first substrate, the first electrode, the organic compound layer and the second electrode being disposed in this sequence;
a first insulative portion and a second auxiliary electrode formed between the first electrode and the second electrode in this sequence from the first electrode; and
a first auxiliary electrode and a second insulative portion formed in this sequence from the first electrode between the first and second electrodes and at a position where the first insulative portion and the second auxiliary electrode are not formed, wherein
the second electrode is in electrical continuity with the second auxiliary electrode,
the first electrode and the organic compound layer are insulated from the second auxiliary electrode by the first insulative portion,
the first electrode is in electrical continuity with the first auxiliary electrode, and
the organic compound layer is insulated from the first auxiliary electrode by the second insulative portion.

3. The organic electroluminescence device according to claim 2, wherein
the first insulative portion and the second insulative portion are formed of the same material.

4. The organic electroluminescence device according to claim 1, wherein
a distance between the second auxiliary electrode and the first electrode is larger than a thickness of the organic compound layer.

5. An organic electroluminescence device comprising:
a first substrate;
a first electrode formed on the first substrate;
an organic compound layer formed on the first electrode;
a second electrode formed on the organic compound layer;
a first auxiliary electrode in electric continuity with the first electrode and a second auxiliary electrode in electric continuity with the second electrode, the first and second auxiliary electrodes being formed on the first substrate; and
an insulative portion formed between the first auxiliary electrode and the second auxiliary electrode, wherein
the first auxiliary electrode is insulated from the second auxiliary electrode by the insulative portion.

6. The organic electroluminescence device according to claim 5, wherein:
the insulative portion is formed between the first electrode and the second auxiliary electrode and between the organic compound layer and the second auxiliary electrode, and
the first electrode and the organic compound layer are insulated from the second auxiliary electrode by the insulative portion.

7. The organic electroluminescence device according to claim 5, wherein
the first substrate comprises a body shaped in a flat plate and a protrusion perpendicularly projecting from a surface of the body,
the first electrode, the organic compound layer and the second electrode are formed on the protrusion, and
the second auxiliary electrode is formed on the body.

8. The organic electroluminescence device according to claim 7, wherein:
the first auxiliary electrode in electric continuity with the first electrode is formed on the body.

9. The organic electroluminescence device according to claim 7, wherein
the body and the protrusion are formed of different members.

10. An organic electroluminescence device comprising:
a first substrate;
an insulative portion formed on the first substrate;
a first electrode formed on the insulative portion;
an organic compound layer formed on the first electrode;
a second electrode formed on the organic compound layer;
a first auxiliary electrode in electrical continuity with the first substrate; and
a second auxiliary electrode in electrical continuity with the second electrode, the first auxiliary electrode and the second auxiliary electrode being formed on the first substrate through the insulative portion, wherein
the first auxiliary electrode is insulated from the second auxiliary electrode by the insulative portion, and
a thickness of the insulative portion is larger than each of those of the first auxiliary electrode and the second auxiliary electrode when the organic electroluminescence device is seen in a cross section in a thickness direction of the first substrate.

11. The organic electroluminescence device according to claim 1, further comprising:
a second substrate disposed to face the first substrate through the organic compound layer and the second electrode, wherein
the first substrate and the second substrate are transparent substrates, and
the first electrode and the second electrode are transparent electrodes.

12. The organic electroluminescence device according to claim 1, wherein
at least one of the first auxiliary electrode and the second auxiliary electrode comprises: at least one of silver, gold, tungsten, aluminum and nickel; and a binder.

13. An illumination unit comprising the organic electroluminescence device according to claim 1.

14. The organic electroluminescence device according to claim 5, further comprising:
a second substrate disposed to face the first substrate through the organic compound layer and the second electrode, wherein
the first substrate and the second substrate are transparent substrates, and
the first electrode and the second electrode are transparent electrodes.

15. The organic electroluminescence device according to claim 10, further comprising:
a second substrate disposed to face the first substrate through the organic compound layer and the second electrode, wherein
the first substrate and the second substrate are transparent substrates, and
the first electrode and the second electrode are transparent electrodes.

16. The organic electroluminescence device according to claim 5, wherein
at least one of the first auxiliary electrode and the second auxiliary electrode comprises: at least one of silver, gold, tungsten, aluminum and nickel; and a binder.

17. The organic electroluminescence device according to claim 10, wherein
at least one of the first auxiliary electrode and the second auxiliary electrode comprises: at least one of silver, gold, tungsten, aluminum and nickel; and a binder.

18. An illumination unit comprising the organic electroluminescence device according to claim 5.

19. An illumination unit comprising the organic electroluminescence device according to claim 10.

* * * * *